(12) United States Patent
Katz et al.

(10) Patent No.: US 8,330,149 B2
(45) Date of Patent: Dec. 11, 2012

(54) MEGAHERTZ ORGANIC/POLYMER DIODES

(75) Inventors: Howard Edan Katz, Owings Mills, MD (US); Jia Sun, Baltimore, MD (US); Nath Bhola Pal, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 153 days.

(21) Appl. No.: 12/680,308

(22) PCT Filed: Sep. 25, 2008

(86) PCT No.: PCT/US2008/011196
§ 371 (c)(1),
(2), (4) Date: Mar. 26, 2010

(87) PCT Pub. No.: WO2009/045341
PCT Pub. Date: Apr. 9, 2009

(65) Prior Publication Data
US 2010/0244001 A1   Sep. 30, 2010

Related U.S. Application Data

(60) Provisional application No. 60/995,878, filed on Sep. 28, 2007.

(51) Int. Cl.
*H01L 29/08* (2006.01)
*H01L 35/24* (2006.01)
*H01L 51/00* (2006.01)

(52) U.S. Cl. ........ 257/40; 257/E39.007; 257/E51.003; 257/E51.008; 257/E51.01; 257/E51.011

(58) Field of Classification Search ............... 257/40, 257/E39.007, E51.003, E51.008, E51.01, 257/E51.011
See application file for complete search history.

(56) References Cited

U.S. PATENT DOCUMENTS

| 5,200,668 | A | * | 4/1993 | Ohashi et al. ............. 313/498 |
| 5,349,209 | A | * | 9/1994 | Moyer et al. ............... 257/80 |
| 5,552,678 | A | * | 9/1996 | Tang et al. ............. 315/169.3 |
| 5,681,659 | A | * | 10/1997 | Shi et al. ................. 428/480 |
| 5,726,282 | A | * | 3/1998 | Jenekhe et al. .......... 528/337 |
| 6,720,573 | B2 | * | 4/2004 | Son et al. ................... 257/40 |
| 6,812,638 | B2 | * | 11/2004 | Wakimoto et al. ........ 313/505 |
| 7,035,140 | B2 | * | 4/2006 | Jackson et al. ........... 365/174 |
| 7,193,291 | B2 | * | 3/2007 | Lee et al. .................. 257/472 |
| 7,211,824 | B2 | * | 5/2007 | Lazarev .................... 257/40 |

(Continued)

FOREIGN PATENT DOCUMENTS
JP   61001060 A  *  1/1986

*Primary Examiner* — Ida M Soward
(74) *Attorney, Agent, or Firm* — Edwards Wildman Palmer LLP; Peter F. Corless; Melissa Hunter-Ensor, Esq.

(57) ABSTRACT

Featured is an organic/polymer diode having a first layer composed essentially of one of an organic semiconductor material or a polymeric semiconductor material and a second layer formed on the first layer and being electrically coupled to the first layer such that current flows through the layers in one direction when a voltage is applied in one direction. The second layer is essentially composed of a material whose characteristics and properties are such that when formed on the first layer, the diode is capable of high frequency rectifications on the order of megahertz rectifications such as for example rectifications at one of above 100KHz, 500KhZ, 1MHz, or 10 MHz. In further embodiments, the layers are arranged so as to be exposed to atmosphere.

6 Claims, 29 Drawing Sheets

U.S. PATENT DOCUMENTS

| | | |
|---|---|---|
| 7,276,726 B2 * | 10/2007 | Grushin et al. .................. 257/40 |
| 7,388,100 B2 * | 6/2008 | Nishio ........................... 548/469 |
| 7,456,562 B2 * | 11/2008 | Yokoyama .................... 313/495 |
| 7,582,893 B2 * | 9/2009 | Sokolik et al. .................. 257/40 |
| 2002/0036291 A1 * | 3/2002 | Parker et al. .................... 257/72 |
| 2002/0149025 A1 * | 10/2002 | Andriessen et al. ............ 257/98 |
| 2003/0035979 A1 * | 2/2003 | Chen et al. .................... 428/690 |
| 2005/0156656 A1 | 7/2005 | Rotzoll et al. |
| 2007/0014916 A1 * | 1/2007 | Daniels ........................... 427/66 |
| 2007/0057624 A1 * | 3/2007 | Angelopoulos et al. ...... 313/503 |
| 2007/0096089 A1 | 5/2007 | Lazarev |
| 2007/0215864 A1 * | 9/2007 | Luebben et al. ................ 257/40 |
| 2007/0221958 A1 * | 9/2007 | Aoki ............................. 257/211 |
| 2010/0051915 A1 * | 3/2010 | Jen et al. ......................... 257/40 |
| 2010/0289010 A1 * | 11/2010 | Cho et al. ........................ 257/40 |

* cited by examiner

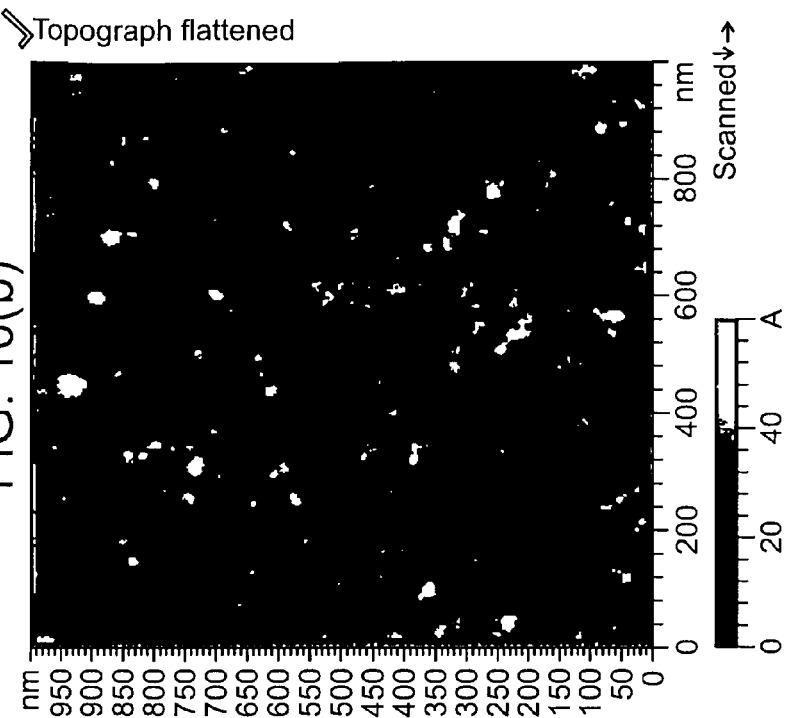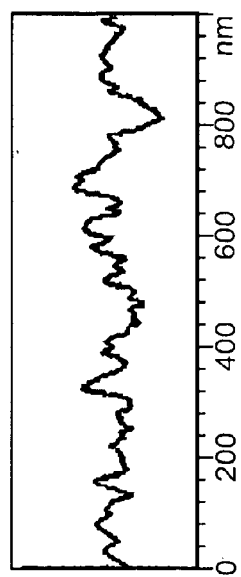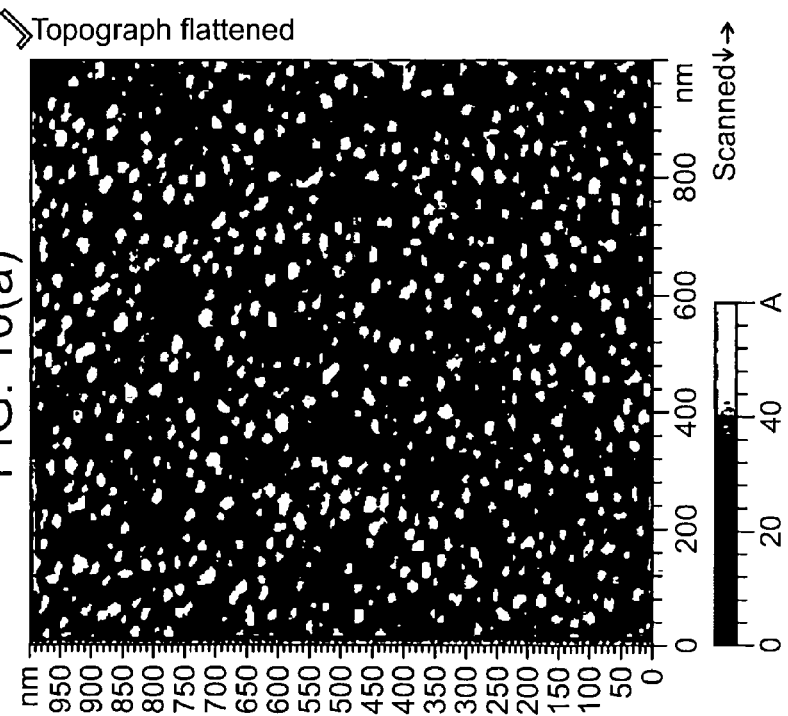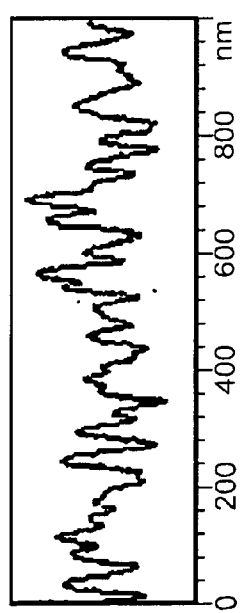
FIG. 10(a)
FIG. 10(b)

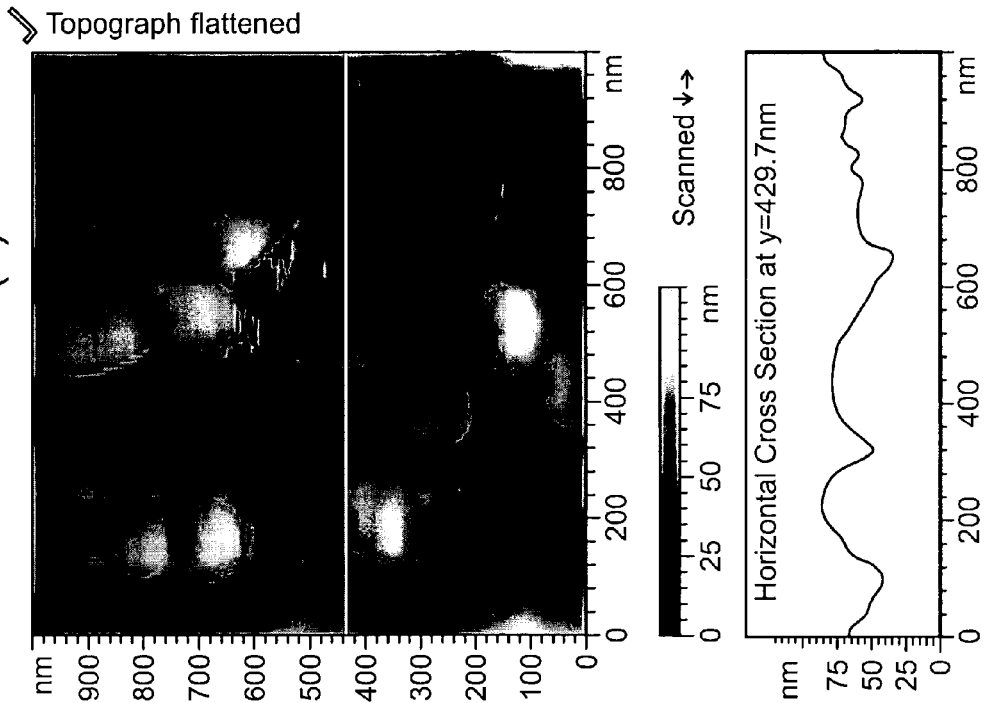
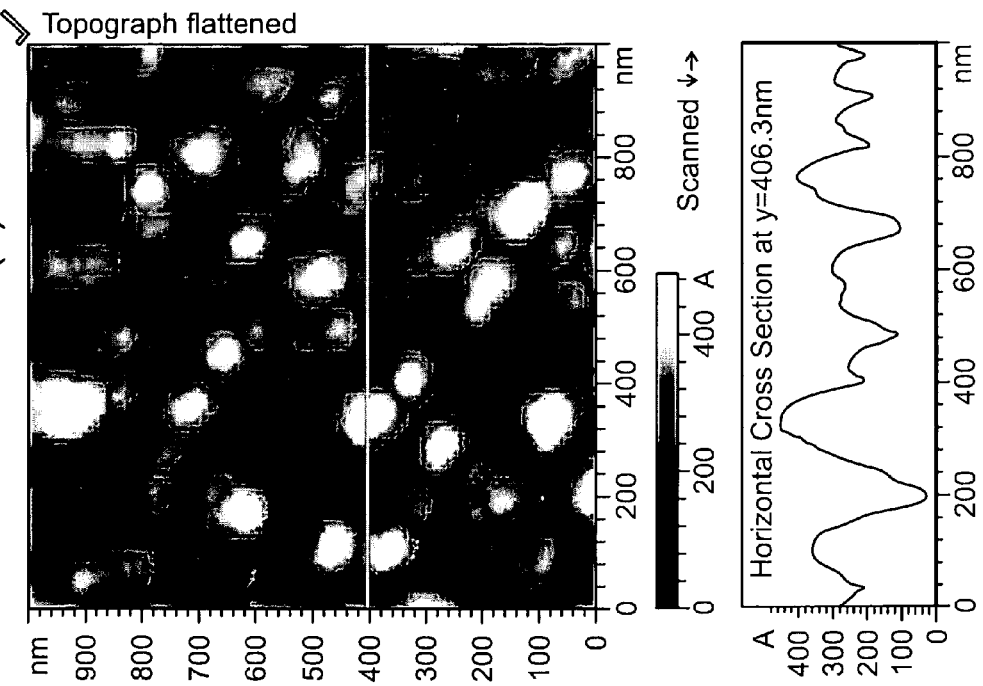

PENTACENE

P3HT

MEGAHERTZ ORGANIC/POLYMER DIODES

RELATED APPLICATIONS

This application is a 35 U.S.C. §371 U.S. national entry of International Application PCT/US2008/011196 (WO 2009/045341) having an International filing date of Sep. 25, 2008 which claims the benefit of US Provisional Application Ser. No. 60/995,878 filed on Sep. 28, 2007, the teachings of which are incorporated herein by reference.

STATEMENT REGARDING FEDERALLY-SPONSORED RESEARCH

The present invention was supported by funding from the U.S. Air Force Office of Scientific Research, grant number FA9550-06-0076, the Department of Energy, contract number DE-FG02-07ER-46465, and a subcontract with Los Alamos National Laboratory. The U.S. Government may have certain rights to the present invention.

FIELD OF INVENTION

The present invention relates to semiconductor diodes that embody organic or polymer semiconductor materials, more particularly to diodes with polymer and inorganic material layers capable of operating in megahertz ranges, and more specifically to such organic diodes embodying pentacene.

BACKGROUND OF THE INVENTION

In electronics, a diode is a component that restricts the directional flow of electrical current or charge carriers. In very basic terms, a diode allows electric current to flow in one direction, but essentially blocks flow of current in the opposite direction. Today, the most common diodes are made from inorganic semiconductor materials such as silicon or germanium.

Organic semiconductors are potentially advantageous for low-cost large-area circuits [T. N. Jackson, Nat. Mater. 2005, 4, 581; D. J. Gundlach, Nat. Mater. 2007, 6, 173; T. W. Kelley, P. f. Baude, C. Gerlach, D. E. Ender, D. Muyres, M. A. Haase, D. Vogel, and S. D. Theiss, Chem. Of Mater. 2004, 16, 4413; R. Parashkov, E. Becker, T. Riedel, H.-H. Johannes, and W. Kowalsky, Proc. Of The IEEE 2005, 93, 1321] based on transistors [F. Garnier, R. Hajlaoui, A. Yassar, and P. Shirakawa, Science 1994, 265, 1684; M. Muccini, Nat. Mater. 2006, 5, 605], diodes [L. S. Roman, M. Berggren and O. Inganas, Appl. Phys. Lett. 1999, 75, 3557; K. M. Chen, Y. X. Zhang, G. G. Qin, S. X. Jin, K. Wu, C. Y. Li, Z. N. Gu, and X. H. Zhou, Appl. Phys. Lett, 1996, 69, 3557], and memory elements [L. Ma, S. Pyo, J. Ouyang, Q. Xu, and Y. Yang, Appl. Phys Lett. 2003, 82, 1419]. The first widespread application will likely be flexible displays [L. Zhou, A. Wanga, S. C. Wu, J. Sun, S. Park, and T. N. Jackson, Appl. Phys Lett. 2006, 88, 083502; J. Kido, M. Kimura, and K. nagai, Science 1995, 267, 1332; M. Berggreni, D. Nilsson, and N. D. Robinson, Nat. Mater. 2007, 6, 3; K. Ziemelis, Nature, 1998, 393, 619; T. Lee, Y. Chung, O. Kwon, and J. Park, Adv. Fun. Mater, 2007, 17, 390].[10-14] Another enticing application is the radio frequency identification tag [T. N. Jackson, Nat. Mater. 2005, 4, 581; K. Finkenzeller, RFID Handbook Vol. 1 Ch. 5, 114 Wiley, New York, 2002; E. Cantatore, T. C. T. Geuns, G. H. Gelinck, E. van Veenendaal, A. F. A. Gruijthuijsen, L. Schrijnemakers, S. Drews, and D. M. de Leeuw, IEEE J S. S. Cir, 2007, 42, 84].

Radio-frequency identification (RFID) technology has attracted attention in many domains, such as pharmaceuticals, health, agriculture, transport, logistics, security and more. RFID technology needs to be available cheaply and that can only be possible when the technology to utilize low-cost integrated circuits is available. One solution for RFID is to utilize printable organic materials. These have been considered in recent years for many practical applications such as thin film transistor circuits [C. D. Dimitrakopoulos, P. R. L. Malenfant, Adv. Mater. 14, 99 (2002)], memory [L. P. Mang, S. Pyo, Q. F. Xu, Y. Yang, Appl. Phys. Lett. 82, 1419 (2003)], display [J. Kido, M. Kimura, K. Nagai, Science 267, 1332 (1995).] and diodes [S. Karg, M. Meier, W. Riess, J. Appl. Phys. 82, 1951 (1997); W. Hu, B. Gompf, J. Pflaum, D. Schweitzer, M. Dressel, Appl. Phys. Lett. 84, 4720 (2004)]. However, the performance of a typical organic diode still can not compete with inorganic semiconductor diodes in circuits due to the low carrier mobility and carrier density when organic diodes are operated.

The properties of organic diodes are strongly influenced by the nature and the structure of the interface between the organic film and the metal electrode. Interface states can control carrier injection according to the alignment of the energy bands of the two materials. Only a few investigations of carrier injection and response speed of organic diodes have been reported [P. F. Baude, D. A. Ender, M. A. Haase, T. W. Kelley, D. V. Muyres, S. D. Theiss, Appl. Phys. Lett. 82, 3964, (2003); L. P. Ma, J. Y. Ouyang, Y. Yang, Appl. Phys. Lett. 84, 4786 (2004); S. Steudel, S. D. Vusser, K. Myny, M. Lenes, J. Genoe, P. Heremans, J. Appl. Phys. 99, 114519 (2006); S. Steudel, K. Myny, V. Arkhipov, C. Deibel, S. D. Vussser, J. Genoe, P. Heremans, Nature Material 4, 597 (2005)].

Recently, the Belgian research organization IMEC reported 50 MHz rectifying Schottky diodes made from pentacene [S. Steudel, S. D. Vusser, K. Myny, M. Lenes, J. Genoe, P. Heremans, J. Appl. Phys. 99, 114519 (2006); S. Steudel, K. Myny, V. Arkhipov, C. Deibel, S. D. Vussser, J. Genoe, P. Heremans, Nature Material 4, 597 (2005)]. They used a 300 nm layer of polycrystalline pentacene deposited on gold, with aluminum on top. In order to improve injection-limited current, they added 20 nm of the conducting polymer poly (3,4,ethylenedioxythiophene PEDOT) (PSS) to improve injection from gold. A pentacene diode with PDOT PSS as interface layer had a roughly five times higher maximum current density compared with the pentacene diode without PDOT:PSS. However, for the pentacene diode with PDOT:PSS as an interface layer, high reverse current was observed. In addition, no result was reported relating pentacene film thickness and the organic diode response speed, and all measurements were obtained in inert atmospheres.

A rectifying device can be fabricated as a result of a barrier in a semiconductor junction/semiconductor pn junction or a metal/semiconductor Schottky contact, as has been demonstrated in many previous publications. At Schottky contacts, efficient charge injection can be achieved if the work function of the non-Schottky metal contact is matched to the Fermi level in the semiconductor. Besides metal/organic interfaces, polymer-organic [W. J. E. Beek, M. W. Wienk, and R. A. Janssen, Adv. Mater. 2004, 16, 1009] and polymer/inorganic [W. U. Huynh, J. J. Dittmer, and A. P. Alivisatos, Science 2002, 295, 2425] semiconductor hetero junctions have also been extensively investigated for their carrier injection mechanisms. However organic/inorganic semiconductor junctions have received less attention in optoelectronic devices such as OLEDs. Recently, there have been a few reports on vertical organic Schottky diodes [L. Ma, J. Ouyang, and Y. Yang, Appl. Phys. Lett. 2004, 84, 4786; S. Steudel, K. Myny, V. Arkhipov, C. Deibel, S. De Vusser, J. Genoe, and P. Heremans, *Nat. Mater.* 2005, 4, 597; S. Steudel, S. De Vusser, K. Myny, M. Lenes, J. Genoe, and P. Heremans, *J. Appl. Phys.* 2006, 99, 114519; S. De Vusser, S. Steudel, K. Myny, J. Genoe, and P. Heremans, *Mater. Res. Soc. Symp. Proc.* 2005, 870E, H1.4.1] although their sustained operation at >1 MHz in ambient environment necessitates encapsulation. The Schottky barriers were formed from highly purified pentacene and aluminum top contacts.

For high speed and high current density diodes, the interface resistance should be very low at forward bias. Two other desirable properties of the device are low conductance in reverse bias and a high breakdown voltage. In the case of a p-n junction diode, electrons and holes moving towards the junction at forward bias recombine.

Also, circuits that require an AC signal to be converted to DC current require rectification. Organic semiconductors have been considered as the basis for such circuits, however, the time constant for organic rectifiers is generally too slow to operate on high-frequency AC signals such as in radiofrequency identification (RFID) tags.

It thus would be desirable to provide organic diodes having polymer and/or inorganic layers in combination with the organic layer and each other, and methods related thereto, especially for high speed operation and for operation in the ambient atmosphere.

SUMMARY OF THE INVENTION

The present invention features an organic/polymer diode having a first and a second layer, where the first layer is composed of an organic semiconductor material or a polymer/polymeric semiconductor material. The first and second layers are electrically coupled to each other such that current flows through the layers in one direction when a voltage is applied in one direction and so that current essentially does not flow through the layers when a voltage is applied in an opposite direction. The second layer is generally composed of a material that when the organic/polymer diode is so structured, the diode is capable of high frequency rectifications on the order of megahertz. In more particular embodiments, any of the organic/polymeric diodes of the present invention are capable of high frequency or megahertz rectifications at one of above 100 KHz, 500 KHz, 1 MHz, or 10 MHz.

In further embodiments, the first and second layers for such an organic/polymer diode are arranged so as to be in an atmospheric environment. In yet further embodiments, the first and second layers for such an organic/polymer diode are in an inert gas atmosphere or vacuum. In more particular embodiments, any of the organic/polymeric diodes of the present invention are capable of high frequency rectifications at one of above 100 KHz, 500 KHz, 1 MHz, or 10 MHz when in any one of an atmospheric environment, an inert gas environment or a vacuum environment.

Such an organic/polymer diode also includes a plurality of electrodes, one electrode being electrically coupled to each of the first layer and the second layer such that the current flows through the layers and the electrodes in one direction when a voltage is applied in one direction.

According to one aspect of the present invention, such an organic/polymer diode includes a first layer that is composed of an organic semiconductor material and a second layer that is composed of an inorganic material such as an inorganic semiconductor material. The first layer of the organic semiconductor material is electrically coupled to the second layer of the inorganic semiconductor material such that current flows through the layers in one direction when a voltage is applied in one direction and so that current essentially does not flow through the layers when a voltage is applied in another or opposite direction.

In further embodiments, the organic semiconductor material is a material within a class of ACENE compounds, and in more particular embodiments the organic semiconductor material comprises pentacene. Also, in further embodiments, the inorganic semiconductor material is an inorganic oxide that exhibits electron carrying semiconductor characteristics, and in more particular embodiments the inorganic oxide comprises zinc oxide.

In yet further embodiments, such an organic/polymer diode further includes a plurality of electrodes, one electrode being electrically coupled to each of the first layer of the organic semiconductor material and the second layer of the inorganic semiconductor material such that the current flows through the layers and the electrodes in one direction when a voltage is applied in one direction. In yet more particular embodiments, the plurality of electrodes, the first layer of the organic semiconductor material and the second layer of the inorganic semiconductor material are configured and arranged so as to form a p-n junction diode.

According to another aspect of the present invention, such an organic/polymer diode includes a first layer that is composed of an organic semiconductor material and a second layer or an interface layer that is composed of a polymer material. The first layer of the organic semiconductor material is electrically coupled to the second layer of polymer material such that current flows through the layers in one direction when a voltage is applied in one direction and so that current essentially does not flow through the layers when a voltage is applied in another direction.

In yet further embodiments, the first layer of the organic semiconductor material is a material within a class of ACENE compounds, and in more particular embodiments the organic semiconductor material comprises pentacene. Also, in further embodiments, the second layer comprises a polymer being characterized as being lightly doped in atmosphere and/or a polymer being characterized as being such that, when the first layer of the organic semiconductor material is grown or deposited on the interface layer, the organic semiconductor material comprising the first layer exhibits large grain structure. In more particular embodiments, the second layer comprises a polymer, wherein the polymer comprises regio-regular poly(3-hexylthiophene) (RR—P3HT).

In yet further embodiments, such an organic diode further includes a plurality of electrodes, one electrode being electrically coupled to each of first layer of the organic semiconductor material and the second layer of polymer material such that the current flows through the layers and the electrodes in one direction when a voltage is applied in one direction. In more particular embodiments, the plurality of electrodes, the first layer that is composed of an organic semiconductor material and the second layer that is composed of the polymer material are configured and arranged so as to form a Schottky diode.

According to yet another aspect of the present invention, such an organic/polymer diode includes a first layer that is composed of a polymeric semiconductor material and a second layer that is composed of an inorganic material. The first layer of the polymeric semiconductor material is electrically coupled to the second layer of the inorganic semiconductor material such that current flows through the layers in one direction when a voltage is applied in one direction and so that current essentially does not flow through the layers when a voltage is applied in another direction.

In yet further embodiments, the first layer of the polymer semiconductor material is any of a number or polymeric semiconductor materials known in the art and adaptable for use in diode applications. In more particular embodiments, such polymeric semiconductor materials comprise thiophene rings with alkyl side chains. In exemplary embodiments, such polymeric semiconductor materials include regio-regular poly(3-hexylthiophene) (RR—P3HT) and Poly(3,3'''-di-dodecyl-2,2',5',2'',5'',2'''-quaterthiophene) (PQT12). Also, in further embodiments, the inorganic semiconductor material is an inorganic oxide that exhibits electron carrying semiconductor characteristics. In more particular exemplary embodiments, the inorganic oxide comprises zinc oxide.

In yet further embodiments, such an organic/polymer diode further includes a plurality of electrodes, one electrode being electrically coupled to each of the first layer of the polymeric semiconductor material and the second layer of the inorganic semiconductor material such that the current flows through the first and second layers and the electrodes in one direction when a voltage is applied in one direction. In more particular embodiments, the plurality of electrodes, the first layer and the second layer are configured and arranged so as to form a Schottky diode.

In yet further embodiments, any of the organic/polymeric diodes of the present invention are capable of high frequency or megahertz rectifications at one of above 100 KHz, 500 KHz, 1 MHz, or 10 MHz when exposed to atmosphere. In yet further embodiments, any of the organic/polymeric diodes of the present invention are capable of high frequency or megahertz rectifications at one of above 100 KHz, 500 KHz, 1 MHz, or 10 MHz when in any one of an atmospheric environment, an inert gas environment or a vacuum environment.

According to yet further aspects of the present invention, there are featured methods for forming any of the organic/polymer diodes of the present invention described herein. According to one embodiment thereof, such a method includes forming a first layer composed of one of an organic semiconductor material or a polymer/polymeric semiconductor material and thereafter forming a second layer on a surface of the first layer and so the first and second layers are electrically coupled to each other. The second layer is composed of a material that when the organic/polymer diode is so structured, the diode is characterized as exhibiting megahertz rectifications.

According to an embodiment of the present invention, such a method includes forming a first layer composed of an organic semiconductor material and thereafter forming a second layer on a surface of the first layer, the second layer being composed of one of inorganic semiconductor material or a polymer. According to another embodiment of the present invention, such a method includes forming a first layer composed of a polymer/polymeric semiconductor material and thereafter forming a second layer on a surface of the first layer, the second layer being composed of an inorganic semiconductor material.

In the foregoing methods, such organic semiconductor material include material within a class of ACENE compounds. More particularly, the organic semiconductor material comprises pentacene.

In the foregoing methods, such inorganic semiconductor materials comprise an inorganic oxide that exhibits electron carrying semiconductor characteristics. More particularly, the inorganic oxide is zinc oxide.

In the foregoing methods, such polymers comprise polymers that are characterized as being lightly doped in atmosphere and also being characterized as being such that, when the organic semiconductor layer is grown or deposited on the interface layer, the organic semiconductor layer exhibits large grain structure. More particularly, the polymer can comprise regio-regular poly(3-hexylthiophene) (RR—P3HT).

In the foregoing methods, such polymer/polymeric semiconductor materials comprise any of a number or polymeric semiconductor materials known in the art and adaptable for use in diode applications. In more particular embodiments, such polymeric semiconductor materials comprise thiopene rings with alkyl side chains. In exemplary embodiments, such polymeric semiconductor materials include regio-regular poly(3-hexylthiophene) (RR—P3HT) and Poly(3,3'''-di-dodecyl-2,2',5',2'',5'',2'''-quaterthiophene) (PQT12).

Such a method can further include forming an electrode on a surface of each of the first and second layers. In more particular embodiments, such a method can further include configuring and arranging the formed first layer, the formed second layer and the formed electrodes so as to create one of a p-n junction diode or a Schottky diode.

Other aspects and embodiments of the invention are discussed below.

DEFINITIONS

The instant invention is most clearly understood with reference to the following definitions:

In electronics, a diode is a component that restricts the directional flow of electrical current or charge carriers. In very basic terms, a diode allows electric current to flow in one direction, but essentially blocks flow of current in the opposite direction. Today, the most common diodes are made from inorganic semiconductor materials such as silicon or germanium, although organic semiconductor materials have begun to be considered for diodes. As is known to those skilled in the art, a diode can be a discrete element or component that is electrically and mechanically coupled to electrical circuitry (e.g., soldered to a substrate or board) or is formed along with other circuitry or electrical elements on a board or substrate.

Organic/polymer diode as that term is used in the subject application shall be understood to mean a diode in which one or more material layers of the diode is composed of an organic semiconductor material or a polymer semiconductor material. An organic diode as that term is used in the subject application shall be understood to mean a diode in which one or more material layers of the diode is composed of an organic semiconductor material. A polymer or polymeric semiconductor diode as that term is used in the subject application shall be understood to mean a diode in which one or more material layers of the diode is composed of a polymer semiconductor material.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

FIG. 6(a) is a diagram of current density versus voltage (I-V) and FIG. 6(b) is a diagram of capacitance versus voltage (C-V) characteristics of the ITO/n-ZnO/p-pentacene/Au diode of Example 1, where $C_0$ is the zero-field capacitance.

FIG. 9(a) is an AFM image of the polycrystalline ZnO film and FIG. 9(b) is an AFM image of the pentacene film.

FIGS. 10(a)-(d) are illustrations of 1.1 μm×1 μm AFM images and line scans, where FIG. 10(a) is an AFM image and line scan of the bare Au electrode; FIG. 10(b) is an AFM image and line scan of the P3HT-Au electrode; FIG. 10(c) is an AFM image and line scan of the 165 nm pentacene film on bare Au electrode and where FIG. 10(d) is an AFM image and line scan of the 165 nm pentacene film on the P3HT-Au electrode.

FIG. 11(a) is a diagram of current versus voltage characteristics of different thickness pentacene-based crossbar diode; FIG. 11(b) is a log-log plot of a 65 nm pentacene-based crossbar diode and FIG. 11(c) is a diagram of the capacitance as a function of applied bias of 65 nm pentacene-based crossbar diode.

DESCRIPTION OF THE PREFERRED EMBODIMENT

Figure 1A:
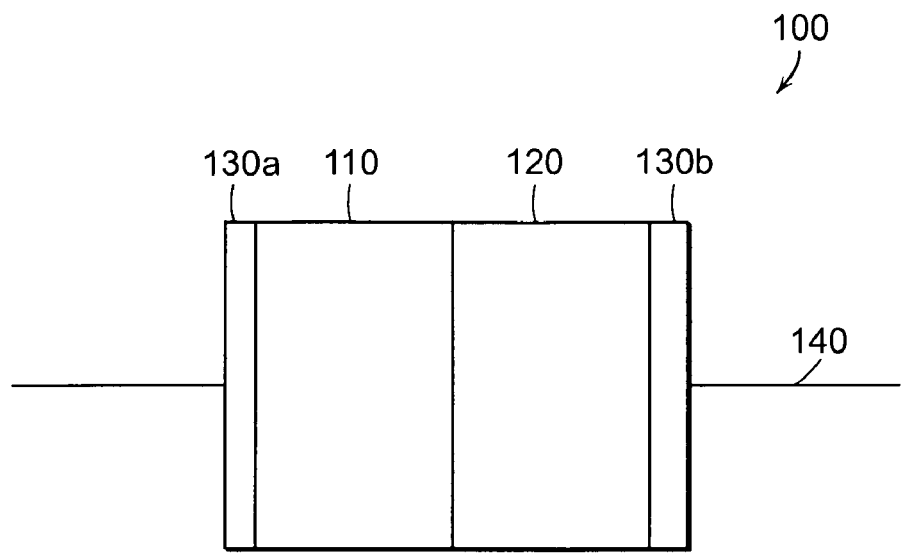
FIG. 1(a) is a schematic view of an organic/polymer diode of the present invention including organic and inorganic semiconductor materials.

Referring now to the various figures of the drawing wherein like reference characters refer to like parts, there is shown in FIG. 1(a) a schematic view of an organic/polymer diode 100 according to one aspect of the present invention that includes a first layer 110 that is composed of an organic semiconductor material and a second layer 120 that is composed of an inorganic semiconductor material. These first and second layers are electrically coupled to each other in any of a number of ways as is known to those skilled in the diode arts. As is also known to those skilled in the diodes arts, the electrodes 130a,b are electrically coupled respectively to the first and second layers 110,120.

The electrode 130a that is electrically coupled to the first layer 110 is preferably composed of gold (Au) or a material whose work function is similar to that of gold. The electrode 130b that is electrically coupled to the second layer 120 is preferably composed of indium tin oxide (ITO) or a material whose work function is similar to that of ITO. It also is contemplated that the electrodes 130a,b can include other materials in such concentrations that do not substantially alter the electrical properties of the electrode material.

The organic semiconductor material making up the first layer 110 is a material generally with the class of ACENE compounds, such as for example, pentacene. Alternatively, such an organic semiconductor material is a material whose electrical and physical characteristics are similar to pentacene. For example, oligomeric semiconductors comprising rings such as thiophene and phenyl are suitable if the work functions, bandgaps, and vertical mobilities are similar to pentacene. Such semiconductors are known in the art of organic electronics. It also is contemplated that the organic semiconductor material of the first layer 110 can include dopants as well as other materials in such concentrations that do not substantially alter the electrical properties of the organic semiconductor layer as descried herein.

The inorganic semiconductor material making up the second layer 120 is composed of any of a number of materials known to those skilled in the art that are inorganic oxides which generally exhibit electron carrying semiconductor characteristics. In an exemplary embodiment the inorganic semiconductor material is zinc-oxide. Alternatively, such an inorganic semiconductor material can comprise an inorganic oxide whose electrical characteristics are similar to those for zinc oxide. It also is contemplated that the inorganic semiconductor material of the second layer 120 can include other materials in such concentrations that do not substantially alter the electrical properties of the inorganic semiconductor material as described herein.

Figure 1B:
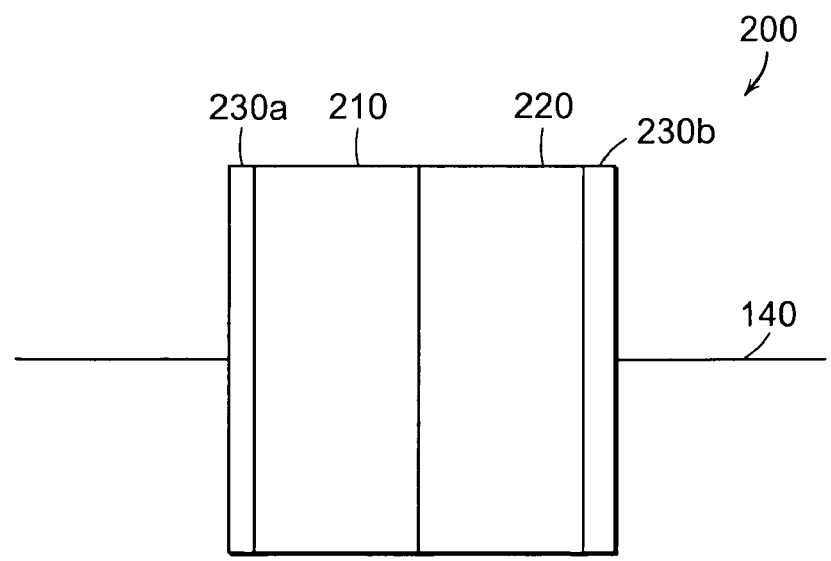
FIG. 1(b) is a schematic view of an organic/polymer diode of the present invention including polymeric and inorganic semiconductor materials.

Referring now to FIG. 1(b), there is shown a schematic view of an organic/polymer diode 200 according to another aspect of the present invention that includes a first layer 210 that is composed of a polymeric semiconductor material and a second layer 220 that is composed of an inorganic semiconductor material, these first and second layers are electrically coupled to each other in any of a number of ways as is known to those skilled in the diode arts. As is also known to those skilled in the diodes arts, the electrodes 230a,b are electrically coupled respectively to the first and second layers 210, 220. Reference shall be made to the discussion above regarding the properties and characteristics of the second layer 120, including the material composition thereof, except as otherwise described below.

The electrode 230a that is electrically coupled to the first layer 210 is preferably composed of gold (Au) or a material whose work function is similar to that of gold. The electrode 230b that is electrically coupled to the second layer 120 is preferably composed of indium tin oxide (ITO) or a material whose work function is similar to that of ITO. It also is contemplated that the electrodes 230a,b can include other materials in such concentrations that do not substantially alter the electrical properties of the electrode material.

The polymeric semiconductor material making up the first layer 110 is any of a number or polymeric semiconductor materials known in the art and adaptable for use in diode applications. In more particular embodiments, such polymeric semiconductor materials comprise thiopene rings with alkyl side chains. In exemplary embodiments, such polymeric semiconductor materials include regio-regular poly(3-hexylthiophene) (RR—P3HT) and Poly(3,3'''-didodecyl-2,2',5', 2'',5'',2'''-quaterthiophene) (PQT12).

Figure 2:
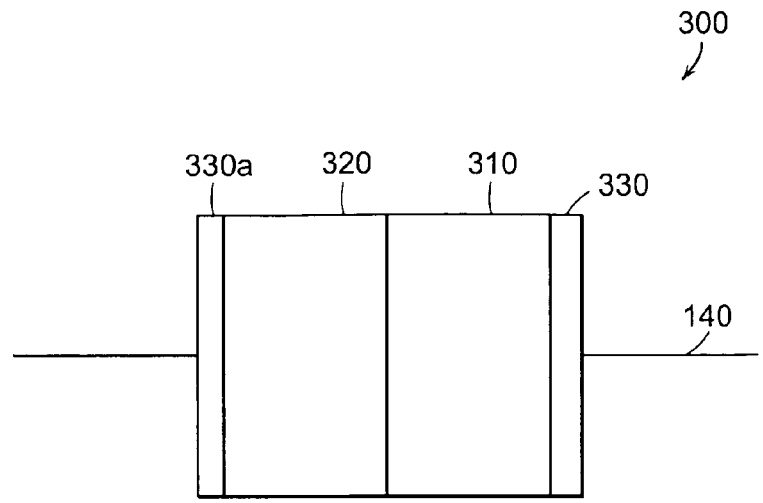
FIG. 2 is a schematic view of an organic/polymer diode of the present invention including an organic semiconductor material and a polymer material.

Referring now to FIG. 2, there is shown a schematic view of an organic/polymer diode 300 according to yet another aspect of the present invention that includes an organic semiconductor layer 310 and a second or interface layer 320 that are electrically coupled to each other in any of a number of ways as is known to those skilled in the diode arts. As is also known to those skilled in the diodes arts, the electrodes 330a,b are electrically coupled respectively to the interface layer 320 and the organic semiconductor layer 310.

The electrode 330a that is electrically coupled to the interface layer 320 is preferably composed of gold (Au) or a material whose work function is similar to that of gold. The electrode 330b that is electrically coupled to the organic semiconductor layer 310 is preferably composed of aluminum (Al) or a material whose work function is similar to that of Al. It also is contemplated that the electrodes 330a,b can include other materials in such concentrations that do not substantially alter the electrical properties of the electrode material.

The organic semiconductor layer 310 is composed of a material generally with the class of ACENE compounds, such as for example, pentacene. Alternatively, such an organic semiconductor layer 310 is composed of a material whose electrical and physical characteristics are similar to pentacene. It also is contemplated that the organic semiconductor layer can include dopants as well as other materials in such concentrations that do not substantially alter the electrical properties of the organic semiconductor layer as descried herein.

The second layer or interface layer 320 is composed of any of a number of polymers known to those skilled in the art that are generally characterized as being lightly doped in atmosphere and/or such that, when the organic semiconductor layer 310 is grown or deposited on the interface layer 320, the organic semiconductor layer generally exhibits large grain structure. In an exemplary embodiment, the interface layer 320 comprises regio-regular poly(3-hexylthiophene) (RR—P3HT). In alternative embodiments, the interface layer 320 is composed of a polymer having similar characteristics as those for RR—P3HT. It also is contemplated that the interface layer 320 can include other materials in such concentrations that do not substantially alter the above described polymer characteristics.

In further embodiments, any of the organic/polymer diodes 100, 200, 300 of the present invention can include any of a number of electrical couplers 140 known to those skilled in the art, for example, wires or the electrical connectors embodied in printed circuit boards to electrically couple the electrodes 130a,b; 230a,b 330a,b with other electrical circuitry or elements as are known to those skilled in the arts. In particular embodiments, it is contemplated that the structure of any of the organic/polymer diodes 100, 200, 300 of the present invention is formed along with other circuitry elements such as for example, during the process of making a printed circuit board or substrate. In such an case, it is likely that the organic/polymer diode would be subjected to the same atmospheric conditions that the circuit board or substrate would be exposed to in the normal operating environment. For example, if the circuit board is exposed to normal atmospheric conditions, the organic/polymer diode 100, 200, 300 embodied in such a circuit board also would be exposed to normal atmospheric conditions.

It also is contemplated and thus within the scope of the present invention, for such an organic/polymer diode 100, 200, 300 to be made so as to form a discrete element, which would be electrically and mechanically coupled to the electrical circuitry (e.g., soldering of the wire leads of the diode to the circuitry). In such a case, the organic/polymer diode would further include a housing as is known to those skilled in the art so as to, for example, encapsulate the electrical structure of the organic/polymer diode as described herein. As the organic/polymer diodes 100, 200, 300 of the present invention are suitable for operation when exposed to normal environmental conditions (e.g., air), such a housing need not be sealed or hermetically sealed, as is the case with some conventional diodes embodying organic semiconductor materials. It also is contemplated and thus within the scope of the present invention, for such an organic/polymer diode 100, 200, 300 of the present invention to be arranged so that the diode is in any of a number of environments known ton those skilled in the art, including but not limited to an atmospheric environment, an inert gas environment, or a vacuum environment. In such cases, a housing would be provided to maintain such an environment.

EXAMPLE 1

We report on n-ZnO/p-pentacene vertical p-n junction diodes on am ITO-coated glass. Microstructures of ZnO and pentacene films comprise pentacene grains with about twice the extent of the underlying layer of ZnO grains, implying substantial interfacial contact. The maximum current density is 160 A/cm². This device or diode operates at AC rectification frequencies exceeding 15 MHz in ambient environment conditions. This ambient rectification frequency is higher than other reported organic Schottky diodes with lower operating voltage, suggesting practical advantages for hybrid p-n junctions. This device is formed using high-mobility, highly stable ZnO as the n-semiconductor and high-mobility pentacene as the p-semiconductor. The grain sizes of the ZnO and the pentacene are of the same order of magnitude, leading to intimate interfacial contact between the p and n layers. The avoidance of a low work function metal is likely an additional stabilizing factor.

Methods:

A continuous ZnO nanoparticle film was prepared on the ITO substrate by thermally decomposing zinc acetate in the open atmosphere. For this, 10 mM zinc acetate solution was prepared in ethanol. The ITO substrate was dip-coated with this solution with a speed approximately 2 mm/sec with an angle 60° with horizontal. This substrate was immediately placed on a 70° C. heater. This process was repeated four times. Then, the heater temperature with the substrate on it was raised to 200° C. at a rate 20° C./min and left at that temperature for 15 minutes. In this period, zinc acetate begins to decompose. After this, the temperature was raised to 350° C. and kept for 15 minutes to form a continuous polycrystalline ZnO nanoparticle film [L. Ma, J. Ouyang, and Y. Yang, *Appl. Phys. Lett.* 2004, 84, 4786]. As indicated below, the detailed microstructure was studied by Atomic force microscope (AFM).

A vacuum-deposited, routinely purified pentacene film of thickness•100 nm was then grown on the ZnO-coated ITO substrate. Subsequently, 100 nm-thick gold electrodes were deposited using a TEM grid (200 mesh) as shadow mask. As also discussed hereinafter. measurement of the current-voltage (I-V) characteristics was performed by using a semiconductor parameter analyzer (Agilent 4155C), where as capacitance-voltage (C-V) was measured using an LCR meter (Agilent 4284A). Rectification characteristics were studied by using a function generator (Agilent 33220A) and an oscilloscope (Agilent DSO 3062A). The output signal was taken across a 200Ω load resistance. All electrical characterization results reported herein were obtained under ambient atmospheric conditions.

Figure 3A:
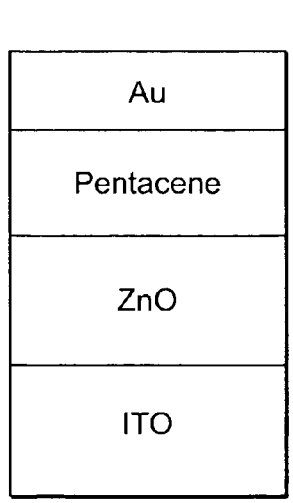
FIG. 3(a) is a schematic of a device/diode structure of Example 1.
Figure 3B:
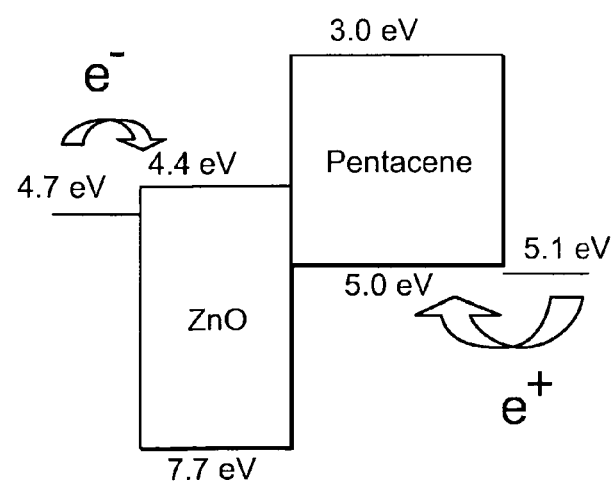
FIG. 3(b) is an energy level diagram with respect to vacuum level.

Device Structure, Characteristics and Results:

The device or diode structure is shown in FIG. 3(a). In this device, ITO and gold (Au) metals were chosen as bottom and top electrodes, respectively. The schematic energy band diagram of an ITO/ZnO/pentacene/Au device is shown in FIG. 3(b). Work functions of ITO and Au are 4.7 eV and 5.1 eV, respectively. The electron injection barrier at the ITO/ZnO interface and the hole injection barrier at the Au/pentacene interface are low, resulting in ohmic contacts at these interfaces.

Figure 6A:
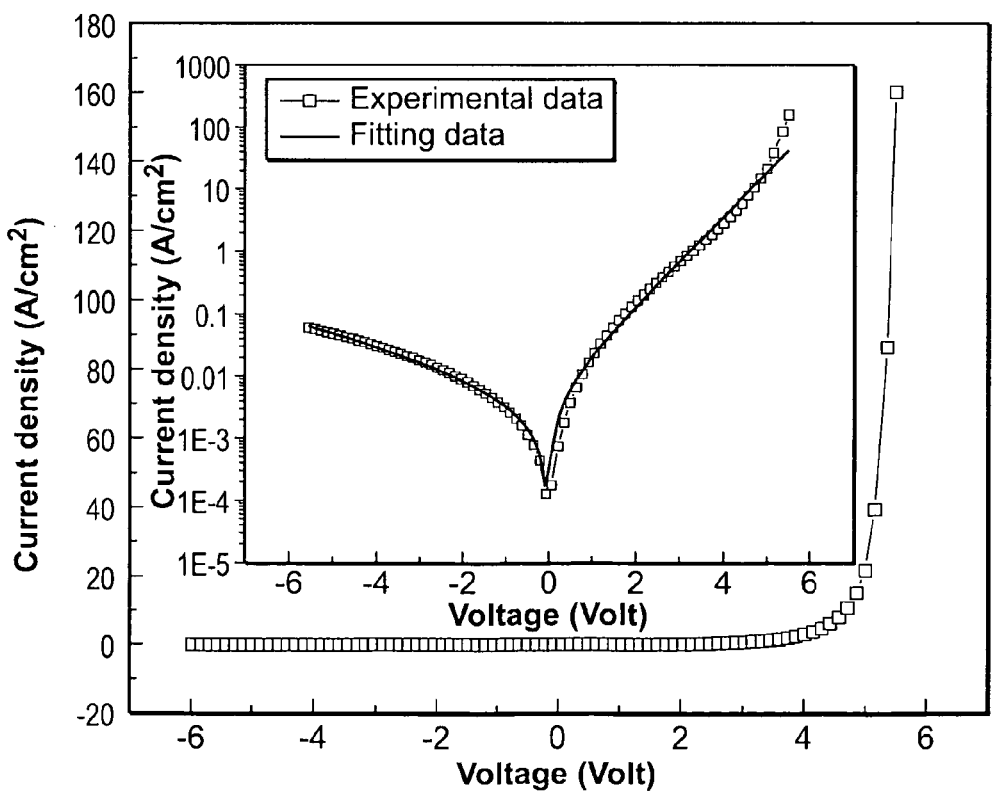
FIGS. 6(a),(b) are diagrammatic views, where

The current density-voltage (I-V) characteristics of the device is shown in FIG. 6(a). The current density is 160 A/cm², which is comparable with other recent organic vertical diodes. The DC rectification ratio at ±5.5 volt is around 3×10³. The turn-on voltage is approximately 1.5 volts, considerably lower than the 5 V for the previously reported pentacene diode. The breakdown voltage of the diode is 25 volts, seventeen times higher than the threshold voltage. The forward bias was analyzed using the thermionic emission model and reverse bias by reverse soft breakdown model [S. M. Sze, *Physics of semiconductor devices*, Wiley, New York, 1981; K. Y. Chiang, H. Y. Tseng, C. Y. Lin, C. P. Kung, and W. H. Hou, *Mater. Res. Soc. Symp. Proc.* 2007, 965, 0965-S05-18].

The total current can be written as $$I = I_S[\exp(qV/\eta kT)-1] - I_{tun}[\exp(-qV/\eta_{tun}kT)-1] \quad (1\text{-}1)$$

where $I_S$ and $I_{tun}$ are the reverse saturation current and tunneling saturation current respectively, and $\eta$ and $\eta_{tun}$ are the ideality factor and tunneling ideality factor.

The fitted values of IV parameters are listed below, and are comparable with other kinds of thin film p-n junction diodes [P. Deb, H. Kim, Y. Qin, R. Lahiri, M. Oliver, R. Reifenberger, and T. Sands, *Nano Lett.* 2006, 6, 2893].

| Is (A) | η | $I_{tun}$ (A) | $\eta_{tun}$ |
|---|---|---|---|
| 4.68 × 10⁻³ | 21.25 | 5.74 × 10⁻³ | 86.4 |

Figure 6B:
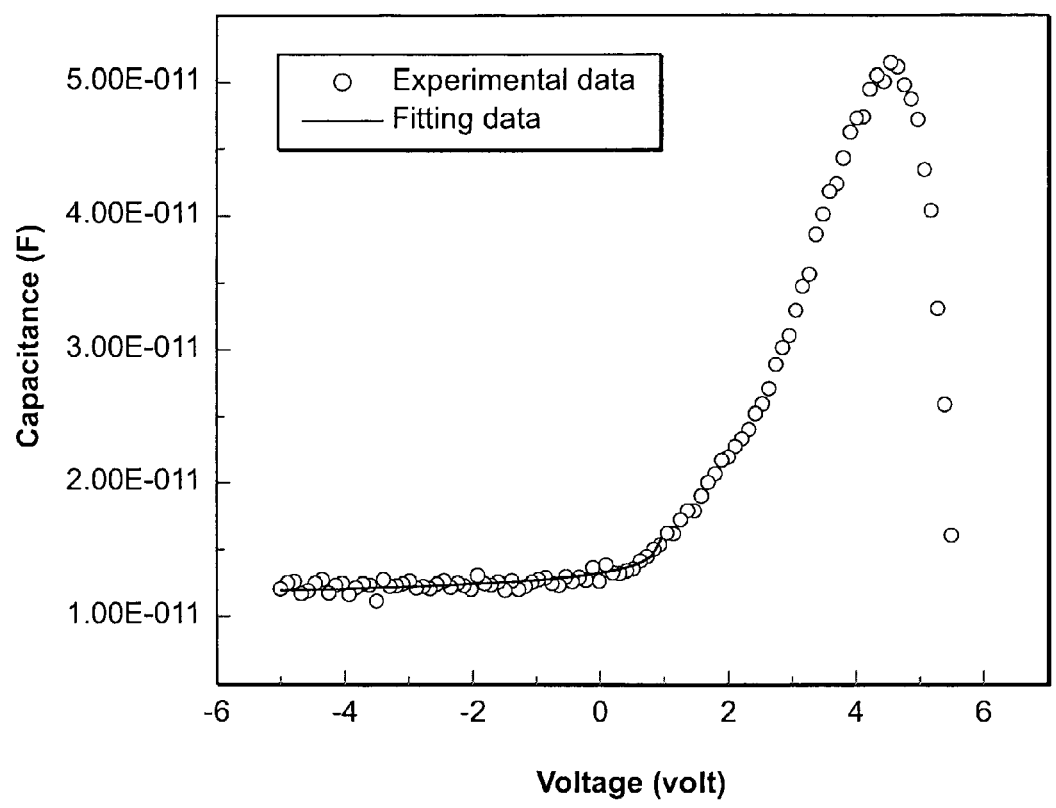
Figure 7A:
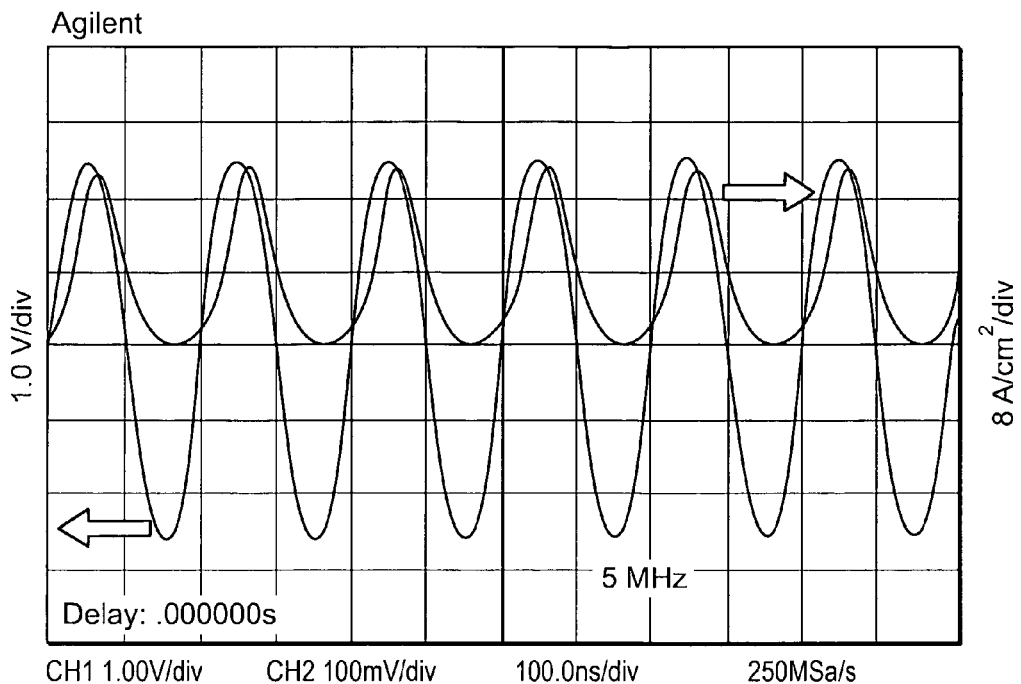
FIGS. 7(a)-(d) are diagrammatic views of rectification behavior at the frequency of 5 MHz (FIG. 7(a)), 13 MHz (FIG. 7(b)), 15 MHz (FIG. 7(c)) and 20 MHz (FIG. 7(d)).
Figure 7B:
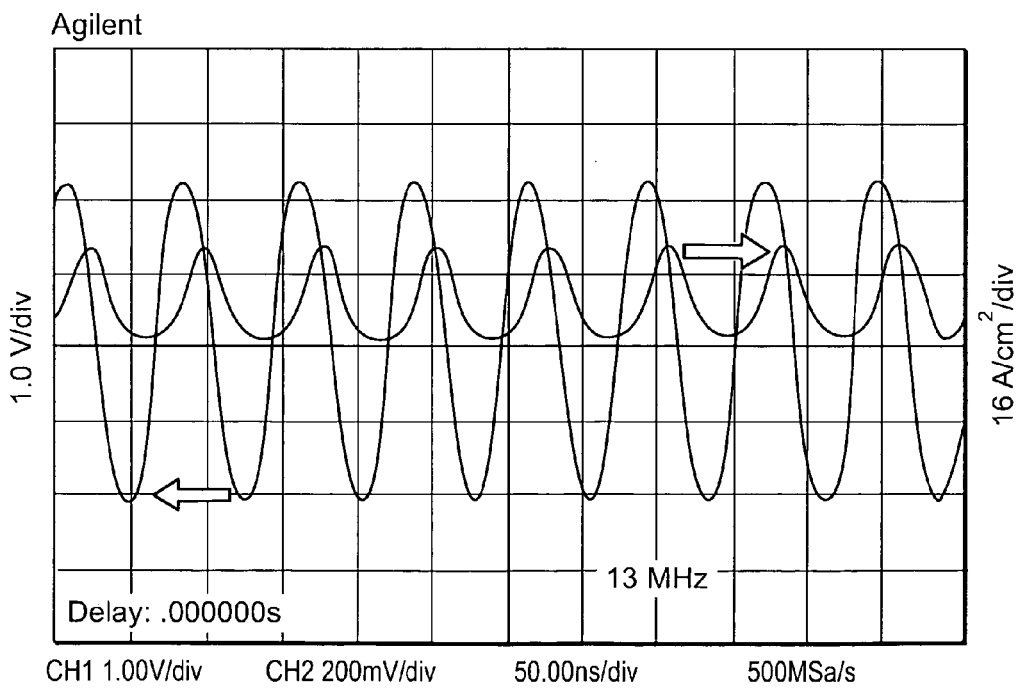
Figure 7C:
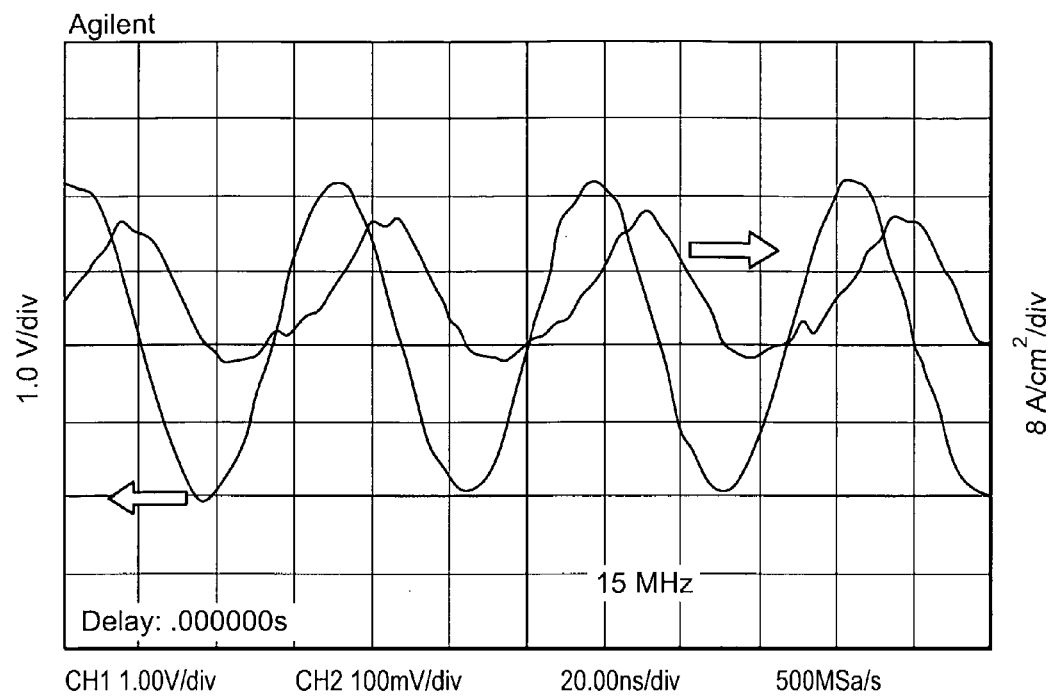
Figure 7D:
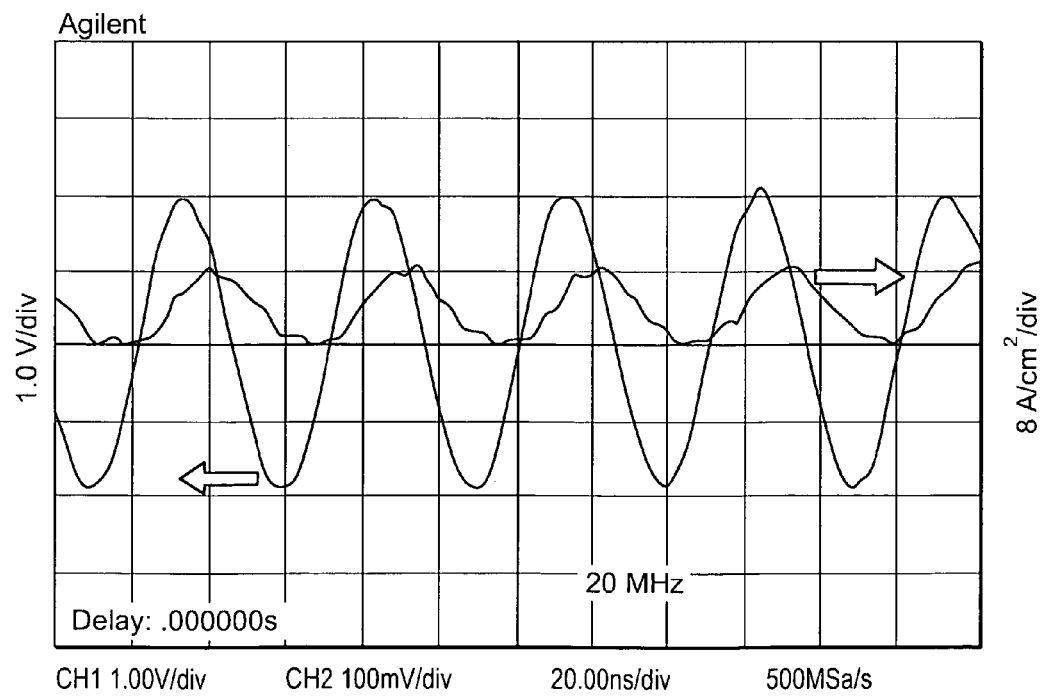

The capacitance-voltage (C-V) behavior at 5 KHz frequency for the device ITO/n-ZnO/p-pentacene/Au is shown in FIG. 6(b). Under reverse bias, capacitance decreases as the absolute value of applied voltage increases, due to the increase in the width of the depletion region. Under a forward bias lower than 4.5 V, capacitance increases with the applied voltage. The reverse bias behavior of the C-V characteristics is typical of a reverse biased p-n junction. The depletion capacitance provides evidence for the formation of a depletion region due to the p-n junction formed by n-ZnO and p-pentacene [M. J. Lee, S. Seo, D. C. Kim, S. E. Ahn, D. H. Seo, I. K. Yoo, I. G. Baek, D. S. Kim, I. S. Byun, S. H. Kim, I. R. Hwang, J. S. Kim, S. H. Jeon, and B. H. Park, *Adv. Mater.* 2007, 19, 73].

This pn junction capacitance can also been fitted by the expression:

$$C = \frac{C_0}{\left(1 - \frac{V}{V_0}\right)^m} \quad (1\text{-}2)$$

Where $C_0$ represents zero bias junction capacitance, and m is the grading coefficient. The fitting parameters $C_0$ and m were obtained as 1.32×10⁻¹¹ and 0.056. The junction potential $V_0$ was assumed to be 1.0 V. and the fitted result is shown by the line in FIG. 4. When forward bias increases more, capacitance increases exponentially, as has previously been observed [K. R. Rajesh, and C. S. Menon, *Semicond. Sci. Tech.*, 2005, 20, 464] and above 4.5 volt capacitance sharply decreases. This is probably an effect of the free carriers which are stored at the depletion region of the p-n junction. At very large forward bias, the junction barrier height is less than a thermal voltage and the energy distribution of the free carriers in the space-charge region is such that the junction barrier is nearly transparent to the sizeable majority carrier population on both sides of the region [J. J. Liou, *Advance Semiconductor Device Physics and Modeling*, Ch. 2, 84 Artech House, 1994].

Figure 4:
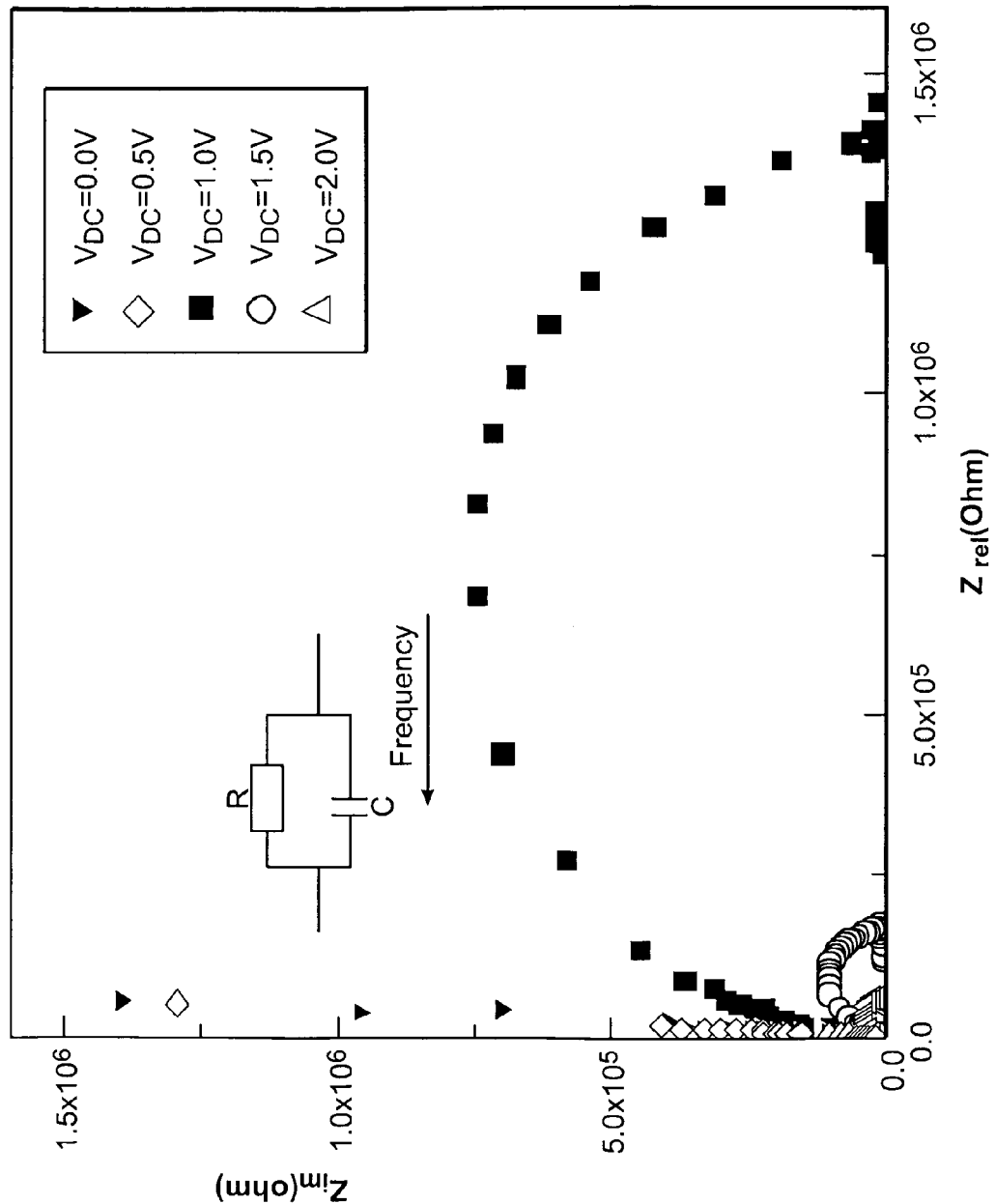
FIG. 4 is a diagrammatic view of a Nyquist plot at different DC bias voltage with an RC circuit inset.

For more information about charge transfer and charge accumulation inside the device, the impedance spectroscopy of the ITO/ZnO/Pentacene/Au system within the frequency range 100 Hz to 1 MHz was studied. The detailed device impedance variation with respect to frequency at different DC bias ($V_{DC}$) is described by a Nyquist plot in FIG. 4, where the real part Re(Z) and imaginary part Im(Z) of the complex impedance Z(ω) [where, Z(ω)=Re(Z)+jIm(Z)] is plotted on X and Y axes respectively. In FIG. 4, an almost ideal semicircle has been obtained for the Re(Z) Vs. Im(Z) plot at the bias voltages 1.0, 1.5 and 2.0V, indicating that the device can be represented by an equivalent parallel R-C circuit (Inset of FIG. 4) in which the capacitance (C) and resistance (R) are frequency independent. FIG. 4 also shows that the variation of Im(Z) for the $V_{DC}$ of 0 and 0.5 V at high frequency range is very sharp and does not follow a complete semicircle, which indicates that in this DC bias range the diode behaves like a pure capacitor. A device with electrodes 0.25 mm on a side also is examined. The circular part of the plot covers a smaller frequency range, 20 to 200 Hz, because of the larger device capacitance.

For a parallel RC circuit, the frequency dependence of Re(Z) and Im(Z) are as follows:

$$\text{Re}(Z) = \frac{R}{1+\omega^2 R^2 C^2} \text{ and,} \qquad (1\text{-}3(a))$$

$$\text{Im}(Z) = \frac{\omega R^2 C}{1+\omega^2 R^2 C^2} \qquad (1\text{-}3(b))$$

At very low frequency range $\omega^2 R^2 C \ll 1$, eq. 1-3(a) can be simplified as Re(Z)=R, which is the diode resistance. From FIG. 4, it is very clear that the value of R sharply decreases when $V_{DC}$ increases from 1.0 V to 2 V, which is very obvious due to the diode's gradually increasing conductance above the turnon voltage. These data are also consistent with the I-V curve shown in FIG. 3(a), which indicates that the turnon is at 1.5 V.

Figure 5:
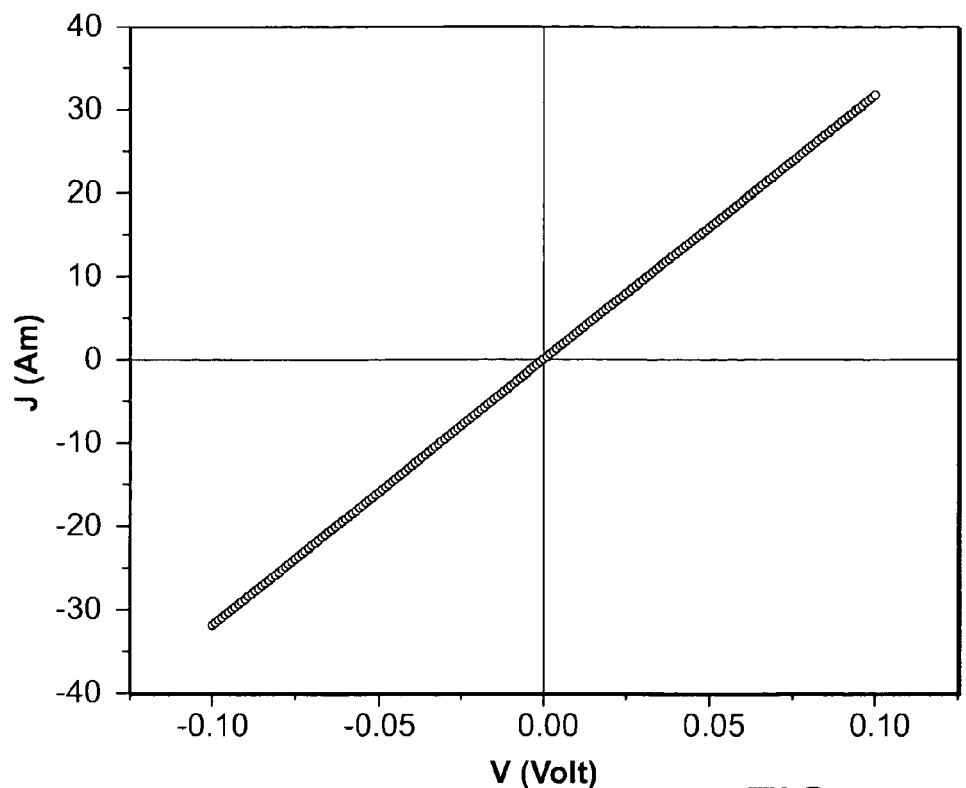
FIG. 5 is diagrammatic view of current density versus voltage (I-V) illustrating I-V characteristics of a typical probe/ITO/AU/probe system.

It also is clear from FIG. 4 that all impedance curves begin at the origin of the Re(Z) Vs. Im(Z) plot, not from any finite positive Re(Z) value, indicating the contribution of probe resistance and capacitance is negligible relative to the whole device. To prove this statement again, another experiment was done where no semiconductor was deposited on the ITO substrate, just an Au electrode. The I-V characteristics of this the probe/ITO/Au/probe system was measured, which gave a linear plot as shown in FIG. 5, indicating an ohmic contact. Resistance calculated from FIG. 4 is $3.1 \times 10^{-3}$ Ω/cm², which is negligibly small with respect to other device parameters.

There is shown in FIGS. 7(a)-(d), the half wave rectification behavior from the device/diode, where the input signals were around 4 volts peak to peak. The signal was taken across 200Ω. Channel 1 and channel 2 refer to the input and rectified signals, respectively. The left and right scales of the plots show the input signal voltage and the rectified current density, respectively. There is a phase shift in the rectified signal which increases with frequency and is caused by the connecting wires, a limitation of the experimental setup.

Figure 8:
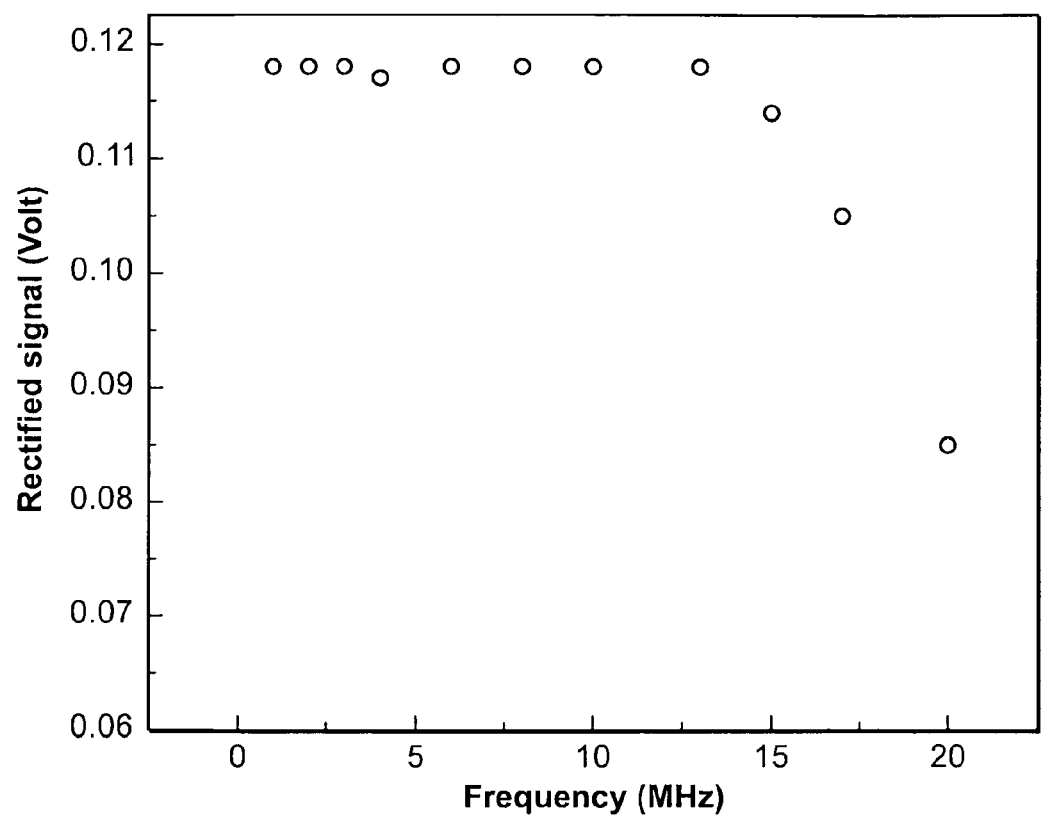
FIG. 8 is a diagram of rectified signal amplitude vs. frequency.

This phenomenon was checked by replacing the sample with a standard Germanium (Ge) diode. There is shown in FIG. 8, the variation of output rectified signal with frequency, indicating the gradual decay of the half wave signal at the high frequency range. At 20 MHz the signal decays to 72% of its 1 MHz intensity. This rectification behavior for a particular device was still stable after few hours of experiments.

The long term storage stability of the device was also studied. The device was kept two months in ambient environment, and retested. The results indicate that it performs to within 90% of its original condition. With respect to open atmosphere measurement, the response speed of this device is much higher than the previously reported organic vertical Schottky diode with relatively less operating voltage.

As indicated above, the detailed microstructure of the ZnO layer was studied by Atomic force microscope (AFM). The AFM micrograph of the ZnO layer is shown in FIG. 9(a). The image shows average particle size around 40 nm with low surface roughness (10 nm). Detailed surface examination indicates that there is a lack of pinholes throughout the film.

Figure 9B:
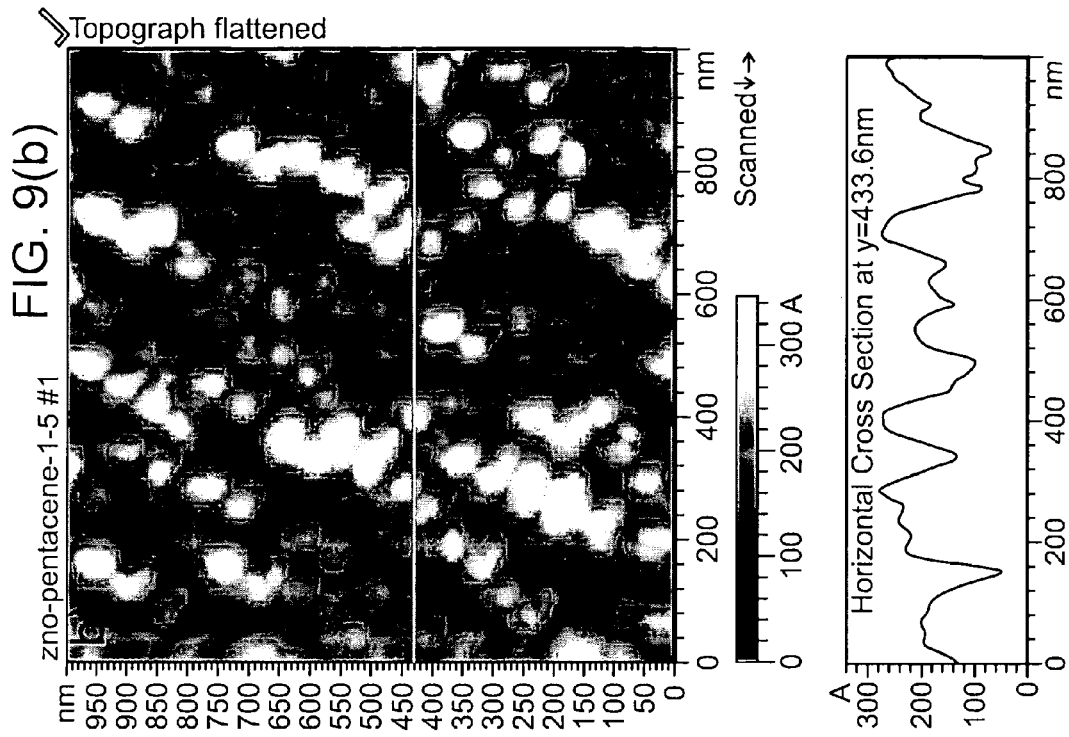
Figure 9A:
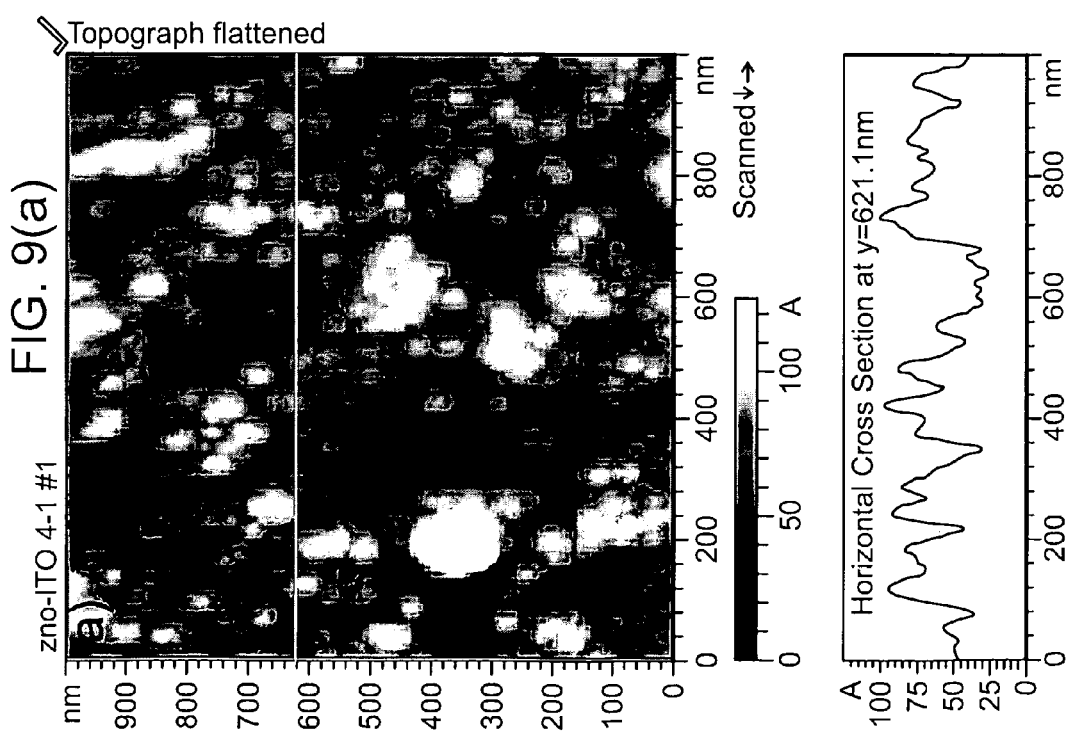
FIGS. 9(a),(b) are illustrations of atomic force microscope images (AFM), where

The AFM image of the surface morphology after pentacene deposition on the ZnO-coated ITO substrate is shown in FIG. 9(b). The average particle size of pentacene is 70 nm with 30 nm maximum roughness. The similar structures of these two images imply that they can form a relative good quality interface leading to the p-n junction of our present device. To avoid pinholes through the top surface, 100 nm of pentacene was deposited. Thus, holes cross one or two grains of pentacene from the gold electrode whereas electrons also cross one or two grains of ZnO from the ITO to recombine at the interface. We believe this compatible morphology is a key to the high current density, high frequency rectification, and operational stability.

EXAMPLE 2

We report the first investigation of regio-regular poly(3-hexylthiophene) (RR-P3HT) as an interface layer for a series of pentacene Schottky diodes with different (65 nm, 100 nm, 165 nm) thicknesses. Gold and aluminum were selected as the anode and cathode respectively. The grain size of pentacene on Au increased from 150 nm to 250 nm after adding P3HT as an interface layer between them. The diode forward bias current density decreased from 30 A/cm² to 5 A/cm² with increasing pentacene film thickness. Pentacene film thickness significantly affects the performance of the diodes; the thinner film displays better device performance. For the 65 nm pentacene-based Schottky diode, megahertz frequency response was observed in air.

Diode Fabrication:

The pentacene diode was fabricated using the following processes. Gold (Au) was patterned on precleaned glass substrates by traditional lithography. The P3HT that was ordered from Rieke Metals Incorporated was purified by Soxhlet extraction with hexane, acetone, and methanol [R. J. Kline, M. D. McGehee, E. N. Kadnikova, J. Liu, J. M. J. Fréchet, Adv. Mater. 15, 1519 (2003)]. 50 nm P3HT was spincoated over the electrodes from 0.5 wt % chloroform solution. After baking at 130° C. for 20 min, different thicknesses of pentacene (65, 100, 165 nm) were deposited on the P3HT through thermal evaporation at a nominal rate of about 0.5 nm/s. The pentacene was purchased from Aldrich and purified using thermal gradient sublimation. Finally, 70 nm of Al was deposited through a shadow mask to form crossbar vertical diodes within the deposition system without breaking vacuum. Film thickness was measured by quartz crystal microbalance. The device area was defined by the cross section between the top (0.3 mm width) and bottom (0.1 mm width) electrode.

Analysis and Results:

Atomic Force Microscopy (AFM) images were obtained with a Molecular Imaging Picoplus microscope. Typically, the samples were investigated at a scan rate of 1 Hz with 512×512 pixel resolution during image capture in tapping mode in air. The current-voltage (I-V) characteristics were tested using an Agilent 4155C semiconductor parameter analyzer. The capacitance-voltage characteristics of the device were measured with an Agilent 4284A precision LCR meter. The transient response of the device was measured with the aid of a TDS-754A Oscilloscope.

AFM images of pentacene-free electrodes are shown in FIGS. 10(a) and 10(b), the latter with P3HT on top. For the completely bare Au electrode, homogeneous nano-particles (or islands) with the maximum height of 8 nm can be observed. The surface morphology of the Au electrode with P3HT is much smoother with only a few islands as high as 6 nm. AFM images of 65 nm pentacene films on Au electrode without P3HT and with P3HT are shown in FIGS. 10(c) and 10(d), respectively. A series of dense crystal grains (<150 nm) are observed for pentacene deposited on the bare Au electrode. However, larger grain sizes (~250 nm) were observed when pentacene was deposited on the P3HT-Au-electrode, preferable for charge transport. Other thicknesses of pentacene film (100 nm and 165 nm) on P3HT-Au electrodes were also imaged by AFM (not shown), similar large grains were observed.

Figure 11A:
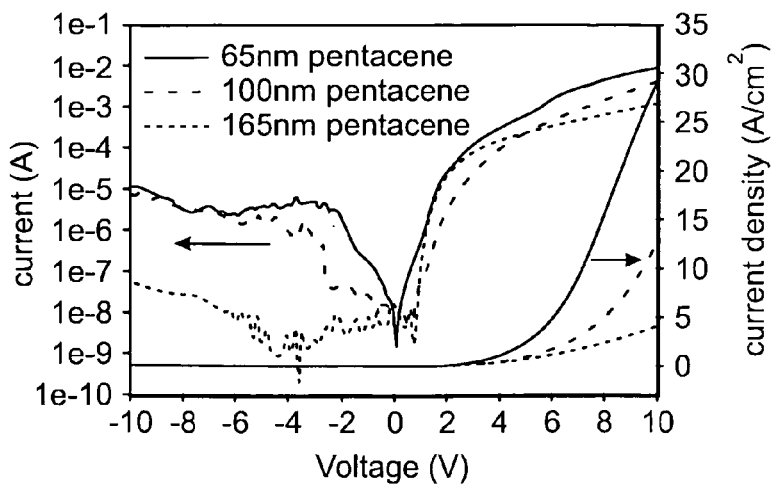
FIGS. 11(a)-(c) are diagrammatic views, where

The current-voltage (I-V) characteristics of the pentacene diode with different thickness are shown in FIG. 11(a). All measurements were performed in air. The current rectification of the device at 10 V is ~1000. The maximum current density changed from 30 A/cm² to 5 A/cm² with increasing pentacene film thickness. Different thicknesses of pentacene diode without the P3HT layer were also prepared and a roughly five times lower maximum current density was observed compared to the pentacene on Au—P3HT electrode (not shown), which can be linked to P3HT improving the charge injection significantly.

Figure 11B:
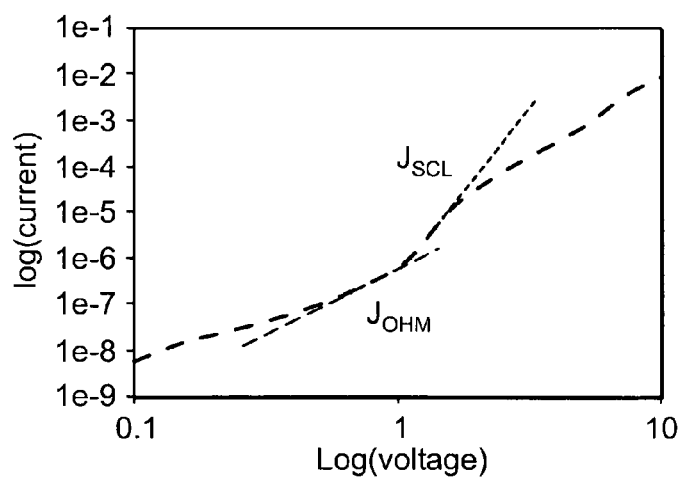
Figure 11C:
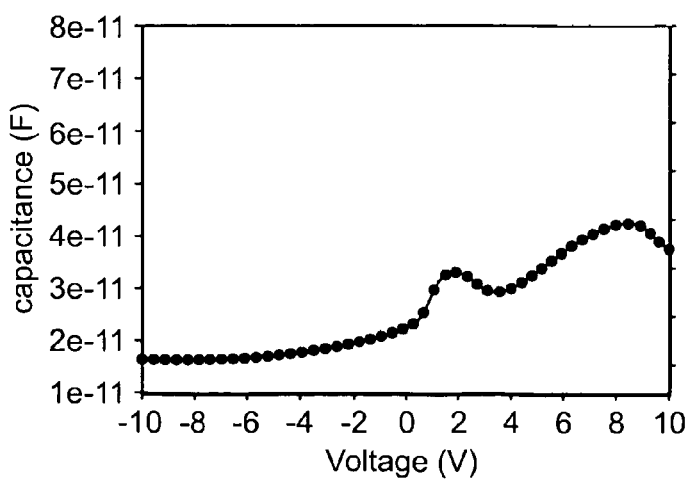

The I-V curve for the 65 nm pentacene film on the P3HT-Au electrode was analyzed in FIG. 11(b) due to its high current density. It can be seen that at low voltages (below 2 V), the current is determined by the motion of free holes and the current density is given by Ohm's law [Y. L. Shen, A. R. Hosseini, M. H. Wong, G. G. Malliaras, Chem. Phys. Chem. 5, 16 (2004)]. When the voltage increases, the rate of charge carrier injection is higher than the rate of transport of carriers that are initially present inside the pentacene film, giving rise to space-charge-limited (SCL) current, and the current density is given by the Mott-Gurney law. This yields a mobility of $7.29 \times 10^{-5}$ cm²V⁻¹S⁻¹. When the voltage is beyond 4V, due to the high electric field, the constant mobility in the SCLS model is no longer applicable. This behavior of the current density is consistent with the capacitance-voltage measurement in FIG. 11(c): the capacitance value was constant from negative bias until around 1 V when it started to increase continually until 2V, which corresponds to the ohmic region, then decreased as the bias voltage is increased further and significant charge injection begins.

Figure 12:
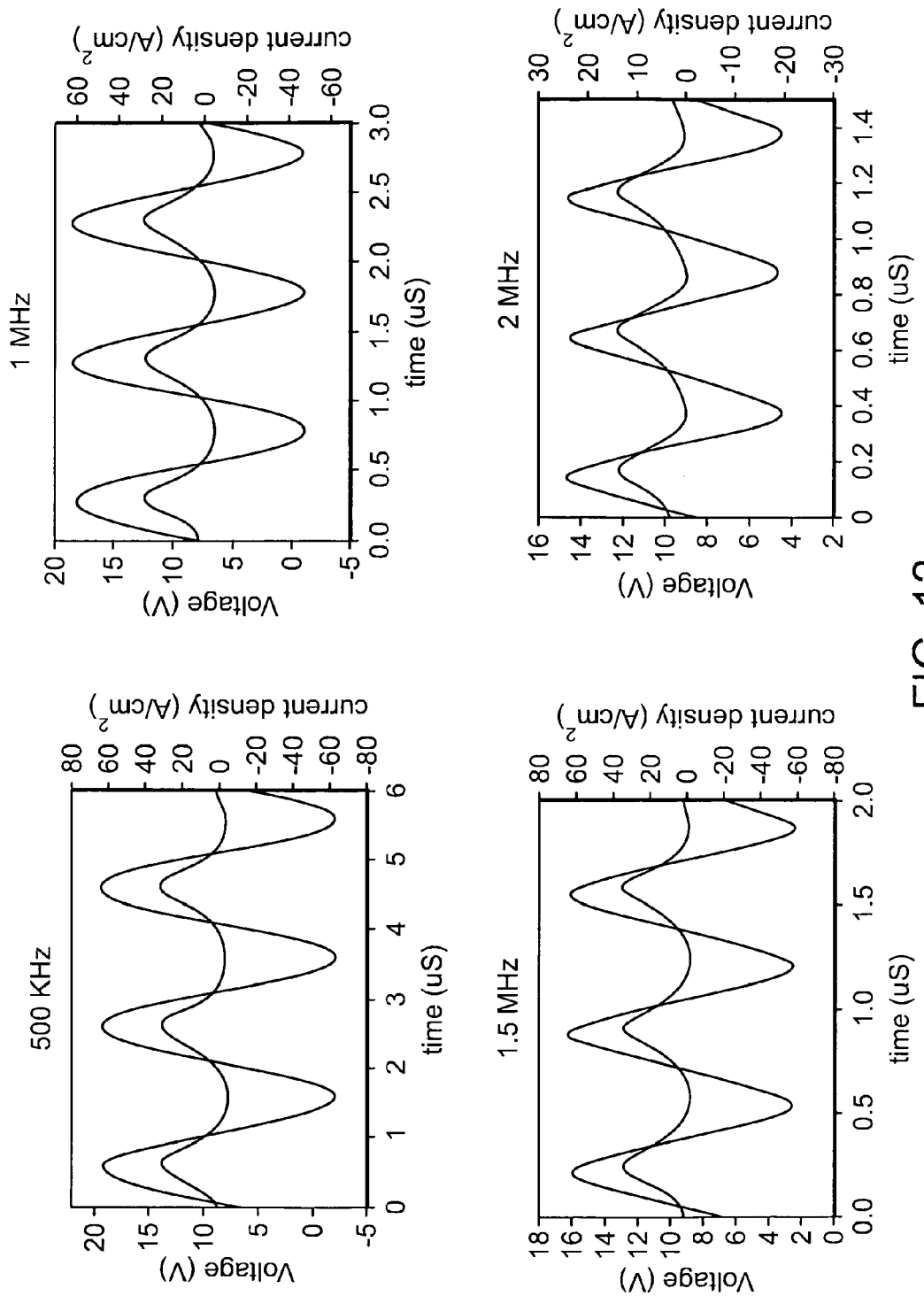
FIG. 12 are diagrammatic views of the current response of a 65 nm pentacene-based crossbar diode in air without device encapsulation under different frequency of AC voltage. The traces or curves in the figures having the larger or taller peaks are depicting the AC input voltage and the traces or curves in the figures having the shorter peaks represent the diode output. A 200Ω resistor was used for response current measurement.

The response speed of the 65 nm pentacene-based Schottky diode is shown in FIG. 12. It can be seen that, at 2 MHz frequency, the device still shows clear rectification behavior. However, for thicker pentacene films (100 nm and 165 nm), the device only shows good rectification at 200 KHz and 100 KHz respectively (not shown).

Figure 13:
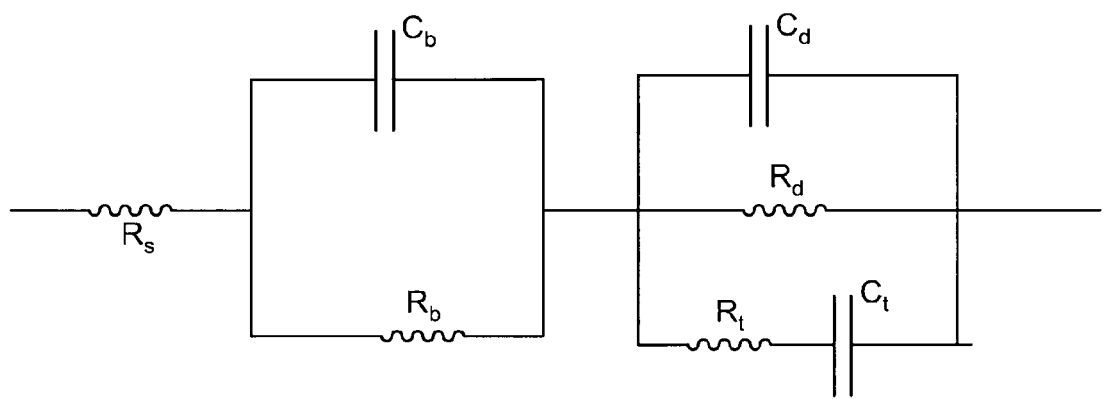
FIG. 13 is an AC model of an organic/polymer diode consisting of bulk capacitance and resistance ($C_b$-$R_b$), junction capacitance and resistance ($C_d$-$R_d$), trap capacitance and resistance ($C_t$-$R_t$) and contact resistance $R_S$.

Referring now to FIG. 13, an AC model of an organic Schottky diode based on the schematic circuit shown therein was used to understand factors affecting the response speed of pentacene-based Schottky diodes [A. Takshi, J. Maddn, J. Appl. Phys. 99, 084503 (2006)]. The relaxation time ($\tau$) can be determined by product of total resistance and capacitance ($\tau$=RC) [Stalling a, H. L. Gomes, M. Murgia, K. Mullen, Org. Electron. 3, 43 (2002)]. The time constant of traps $\tau_t = R_t C_t$ that typically varies from a few nanoseconds for fast traps to a few minutes for slow traps plays an important role in the model.

It was shown above in FIG. 10, that the grain size of pentacene increases from 150 nm to 250 nm after adding P3HT as the interface layer, which should decrease the average time constant of traps because carrier transport throughout the film would be more facile. In addition, the energy level alignment at the Au-pentacene interface also affects diode behavior, and is likely to be improved after adding P3HT as the interface layer. The interface morphology with the addition of P3HT is much more regular with a highly improved surface coverage, which should lead to less contact resistance. On the other hand, increasing film thickness leads to increased bulk film resistance and larger time constants.

In summary, the foregoing demonstrates response speed data at frequencies >1 MHz in pentacene Schottky diodes by using P3HT as interface layer. The current rectification of the device is 1000 and current density can reach 35 A/cm² at 10V. While 2 MHz is not such a high response frequency compared to an inorganic/polymer diode, it is expected that if the diode area is further decreased, pentacene is further purified, and instrumentation for measuring response speed is further optimized, much higher response frequency should be obtained.

EXAMPLE 3

Diode Fabrication

Figure 14A:
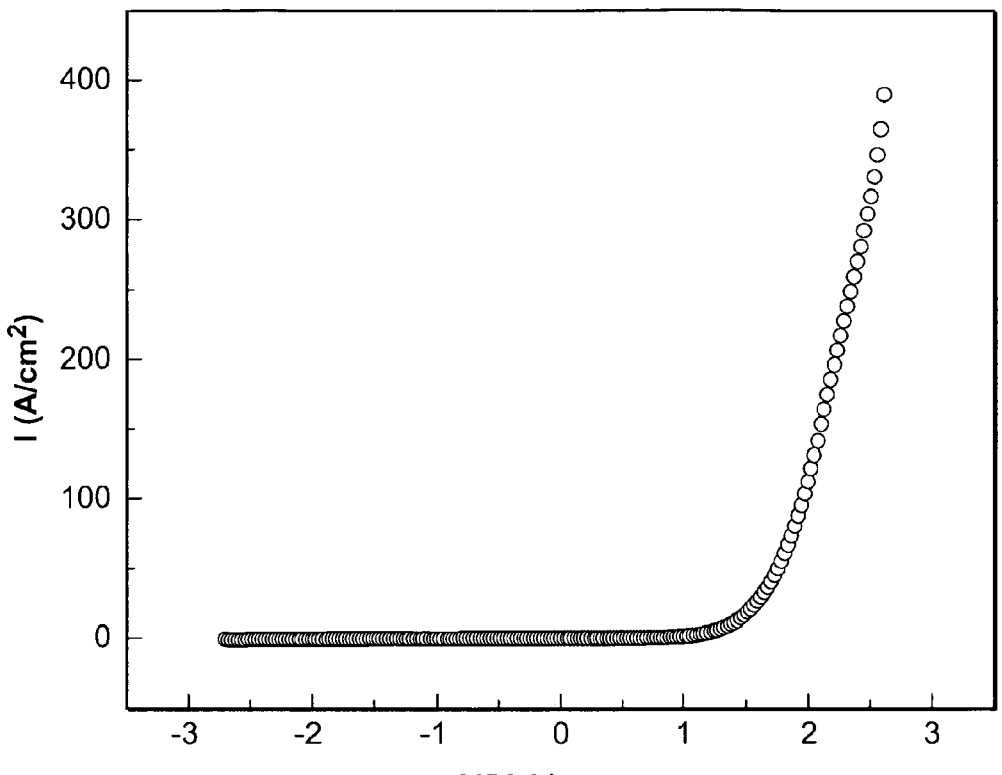
FIGS. 14(a),(b) are diagrammatic views of current density versus voltage (I-V) of the diode of Example 3.
Figure 14B:
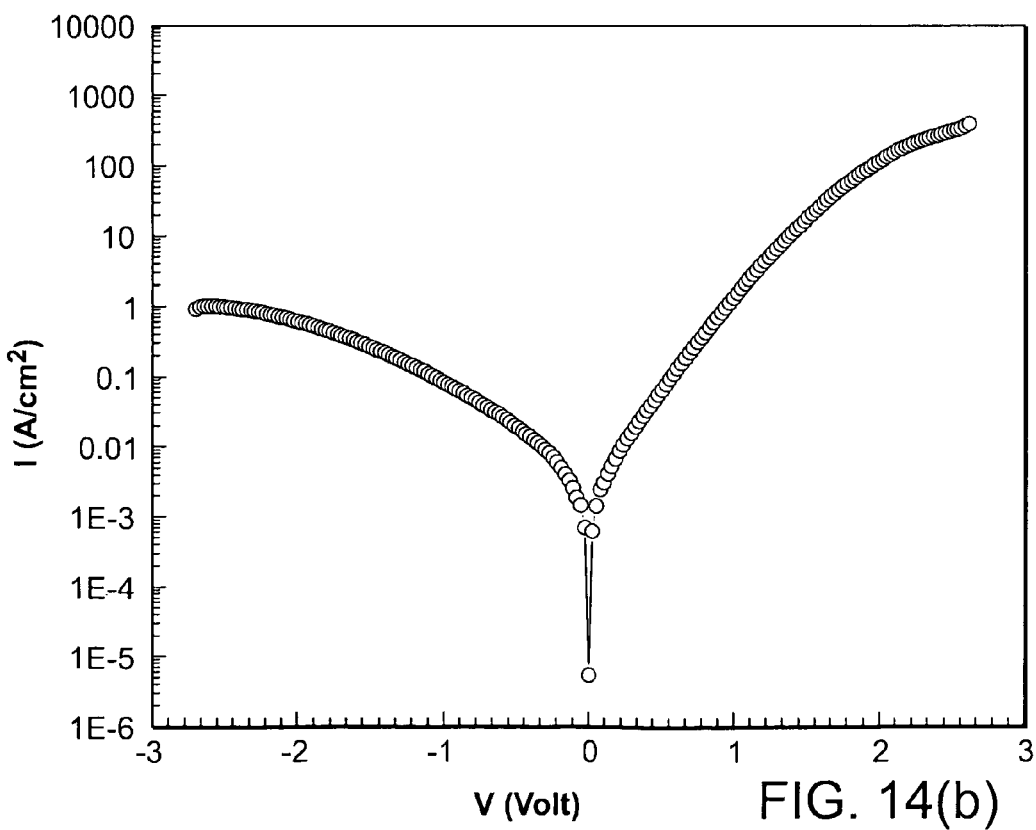
Figure 15A:
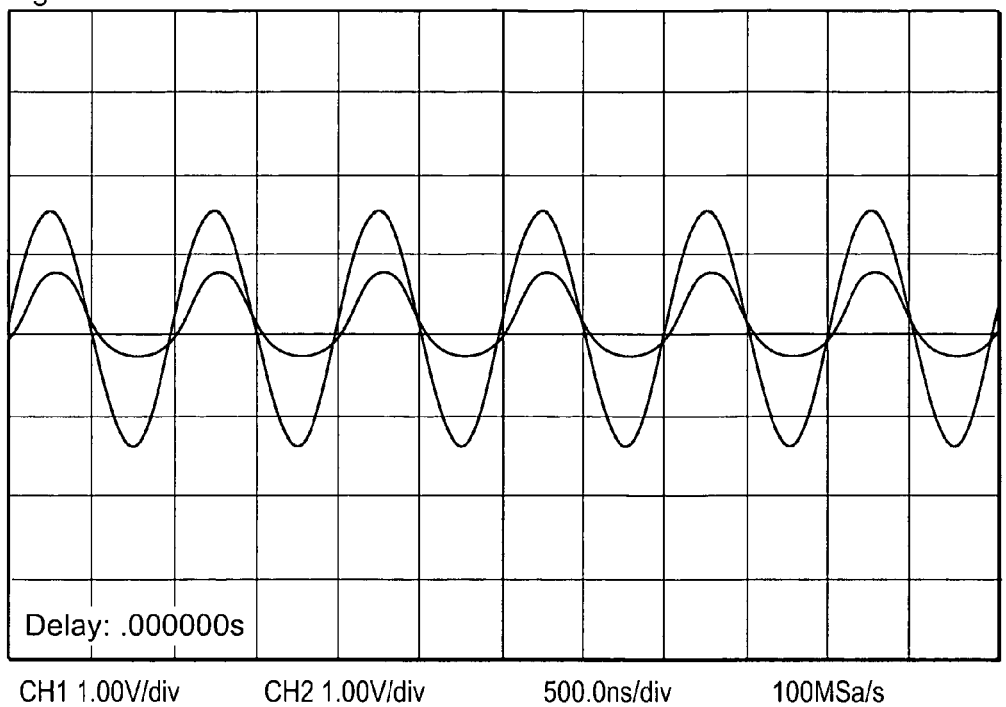
FIGS. 15(a)-(d) are diagrammatic views of rectification behavior at the frequency of 5 MHz (FIG. 15(a)), 13 MHz (FIG. 15(b)), 15 MHz (FIG. 15(c)) and 20 MHz (FIG. 15(d)) for the diode of Example 3.
Figure 15B:
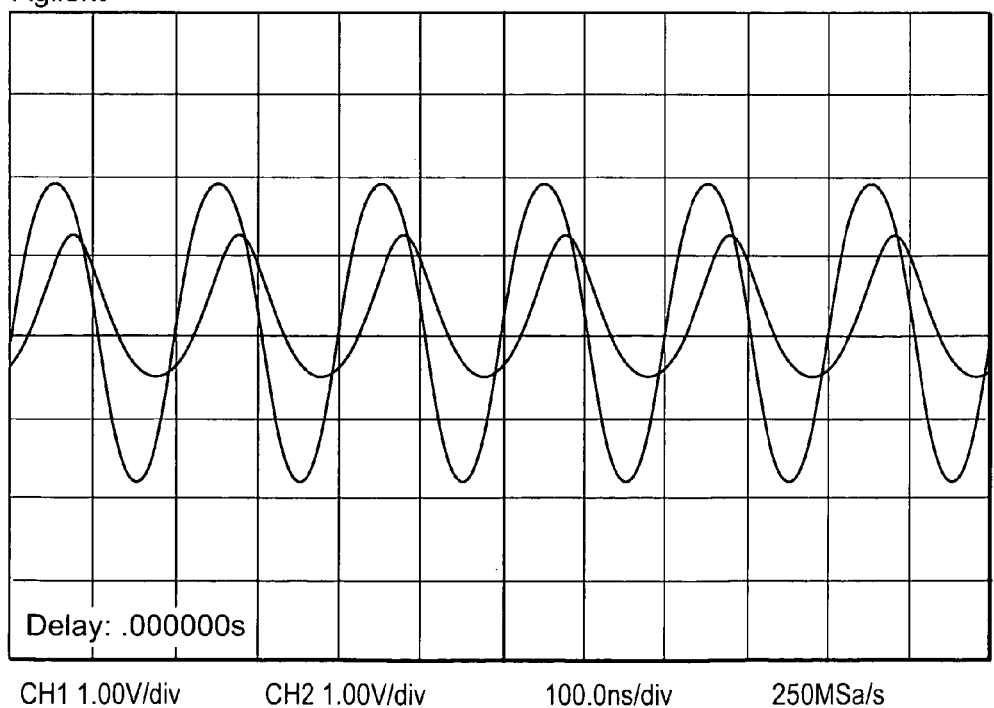
Figure 15C:
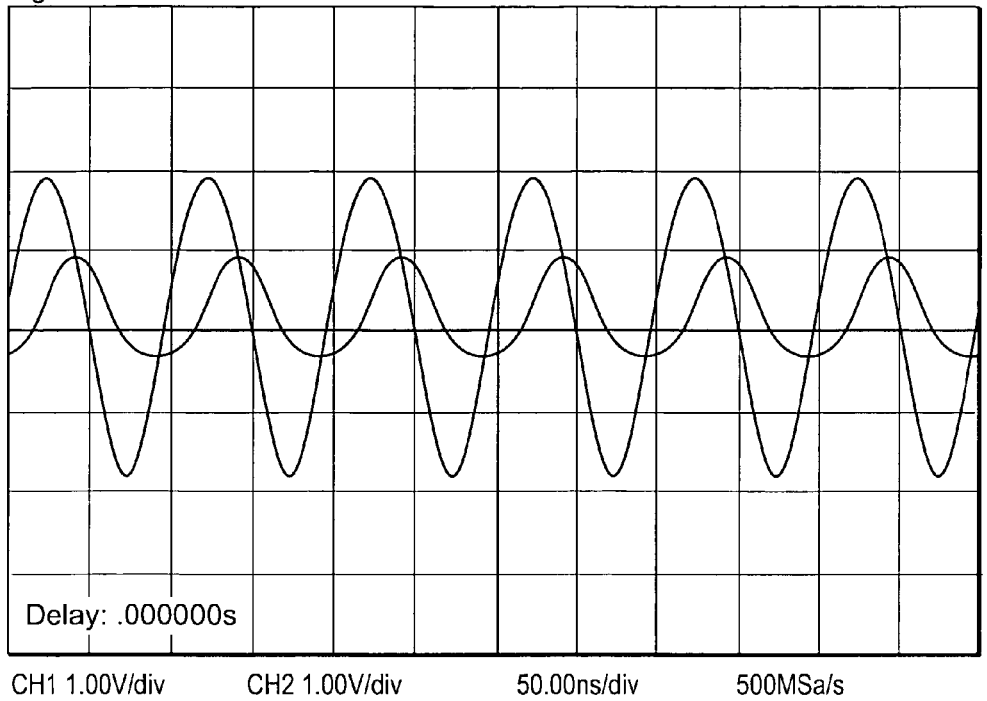
Figure 15D:
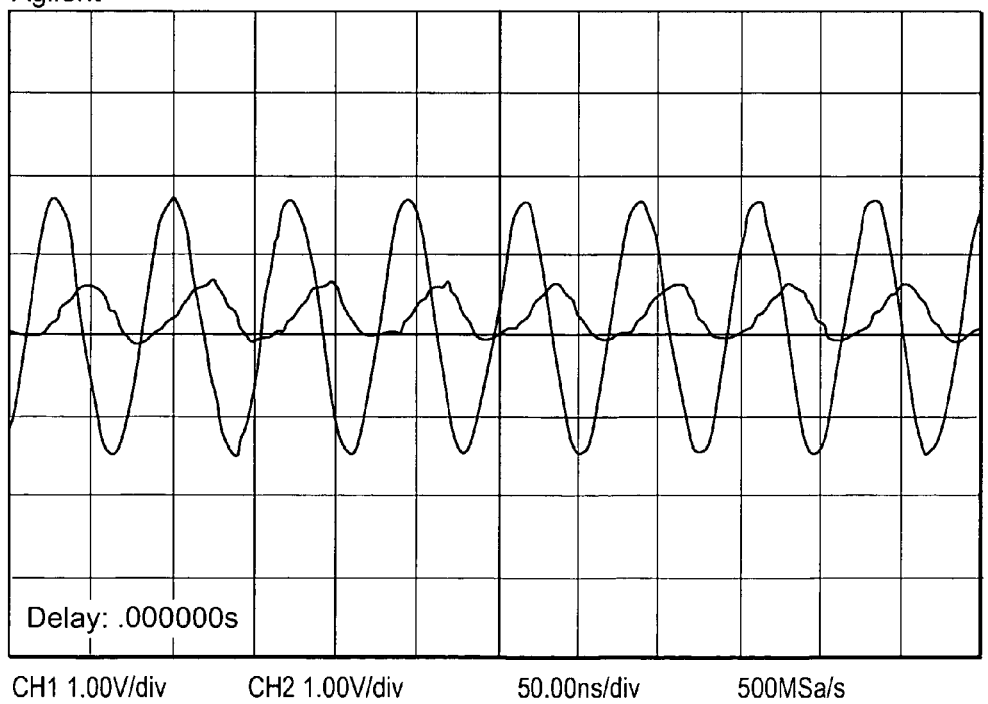

A polymer-ZnO diode was fabricated using the following processes. ZnO was deposited from solution on ITO as described above. Poly(3,3'''-didodecyl-2,2',5',2'',5'',2'''-quaterthiophene) (PQT12) was spincoated from a solution with concentration 7 mg/mL of 1,2-chlorobenzene at a spin rate of 600 rpm. Gold electrodes were patterned as described for the ZnO-pentacene diode. After baking at 150° C. for 15 minutes, the diode was cooled over 30 minutes to 110 degrees, and then further cooled in the ambient to room temperature.
Analysis and Results:

The current-voltage (I-V) characteristics of the diode are shown in FIGS. 14(a),(b). All measurements were performed in air. The current rectification of the device at 2 V is ~400. The maximum current density was 400 A/cm².

The response speed of the diode is shown in FIGS. 15(a)-(d), which show the half wave rectification behavior from the device/diode. Channel 1 and channel 2 refer to the input and rectified signals, respectively. The left and right scales of the plots show the input signal voltage and the rectified current density, respectively. It can be seen that, at 14 MHz frequency, the device still shows clear rectification behavior. As indicated herein, there is a phase shift in the rectified signal which increases with frequency and is caused by the connecting wires, a limitation of the experimental setup.

EXAMPLE 4

Solution-processed n-ZnO/poly(bis(dodecyl)quaterthiophene) (p-PQT-12) vertical p-n junction diodes were prepared on ITO-coated glass. A continuous film of ZnO nanoparticles was grown on the ITO glass by dip-coating and subsequent heat treatment of a zinc acetate film. Poly(didodecylquaterthiophene) (PQT-12) was then spincoated to form the ZnO/PQT-12 diode. Gold was chosen as the top electrode to complement ITO for this diode. The microstructures of ZnO films are studied by atomic force microscopy (AFM) and show a continuous, dense layer of ZnO nanoparticles. The current-voltage (I-V) measurement shows that the maximum current density for this p-n junction diode is 400 A/cm², which is much higher than previously reported polymer diodes. Capacitance-voltage (C-V) data also provide evidence of formation of the p-n junction. The rectification was characterized by observation of full input-half output waves. Data indicate that these devices can operate up to frequencies of 14 MHz. under ambient environment conditions. This rectification frequency is higher than other reported polymer Schottky diodes under these conditions. Turnon voltages of this diode are also much lower than for the reported polymer diodes.

Figure 16:
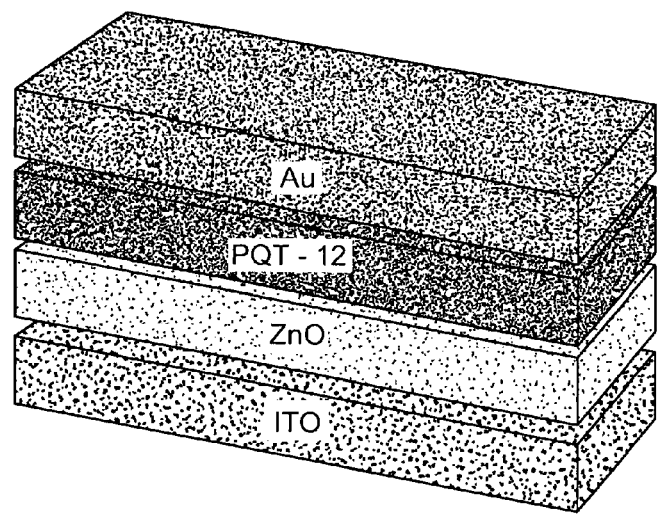
FIG. 16 is a schematic view of the device structure of the ITO-ZnO(n)-PQT-12(p)-Au diode of Example 4.
Figure 17:
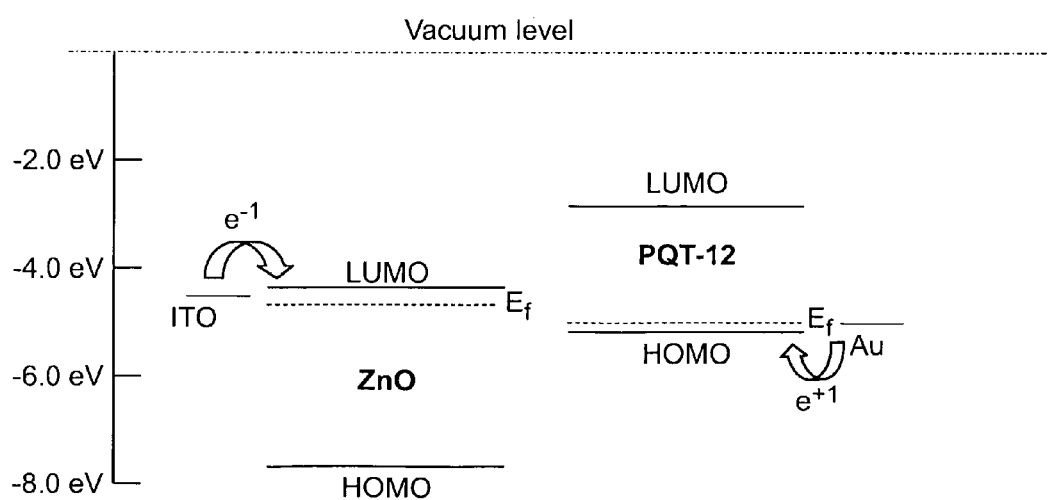
FIG. 17 is a schematic energy band diagram of the ITO/ZnO/PQT-12/Au device of Example 4.
Figure 18:
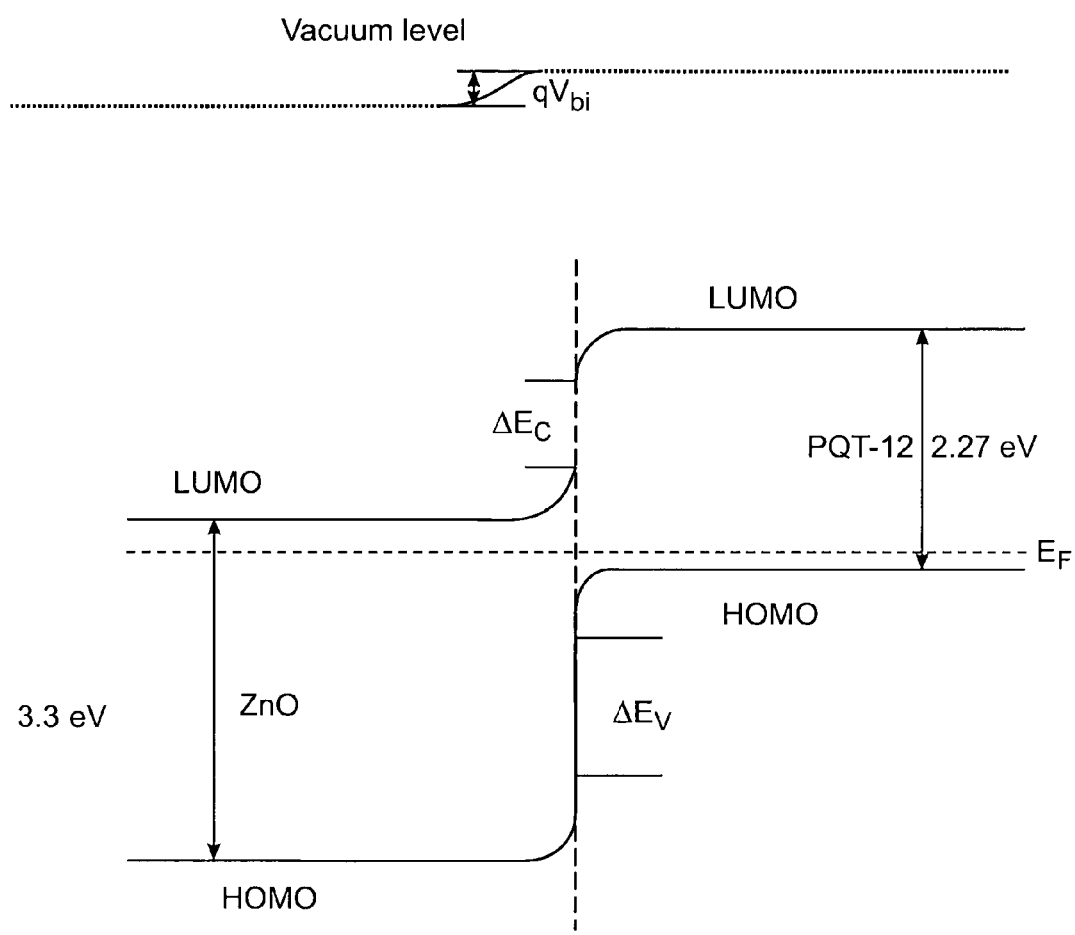
FIG. 18 is a band diagram for ZnO and PQT-12 after heterojunction formation at thermal equilibrium.

Device and band structure of semiconductors:

The device structure is shown in FIG. 16. In n-ZnO/(p-PQT-12) vertical p-n junction diodes, indium tin oxide (ITO) and gold (Au) metals were chosen as bottom and top electrodes, respectively. The schematic energy band diagram of an ITO/ZnO/PQT-12/Au device is shown in FIG. 17. The work functions of ITO and Au are 4.7 eV and 5.1 eV, respectively. The electron injection barrier at the ITO/ZnO interface and the hole injection barrier at the Au/PQT-12 interface are low, resulting in almost ohmic contacts at these interfaces. The band diagram for the ZnO and PQT-12 after their heterojunction formation at thermal equilibrium is shown in FIG. 18. The band gaps of the two semiconductors are, respectively, 3.30 and 2.27 eV. [B. S. Ong, Y. Wu, P. Liu, and S. Gardner, Adv. Mater. 17 (2005) 1141; Ü. Özgür, Ya. I. Alivov, C. Liu, A. Teke, M. A. Reshchikov, S. Doğan, V. Avrutin, S.-J. Cho, and H. Morkoçd, J. Appl. Phys. 98 (2005) 041301].

At thermal equilibrium the quasi-Fermi levels of both semiconductors are equal to the equilibrium Fermi level EF. On the same figure, $\Delta EC$ and $\Delta EV$ correspond to the band offset for conduction bands and valence bands respectively. Since $\Delta EC$ is much lower than $\Delta EV$, the energetic barrier for electrons is lower than for holes. Thus, electrons are the major carriers through these heterojunctions. [J. D. Ye, S. L. Gu, S. M. Zhu, W. Liu, S. M. Liu, R. Zhang, Y. Shi, and Y. D. Zheng, Appl. Phys. Lett. 88 (2006) 182112]. The qVbi is the energy barrier of the junction which is equal to the difference between the bulk Fermi levels of the two semiconductors, where Vbi indicates the barrier potential of the junction. From this figure it is very clear that this barrier height is quite low, which enables high current density, high speed rectification and low turnon voltage [J. D. Ye, S. L. Gu, S. M. Zhu, W. Liu, S. M. Liu, R. Zhang, Y. Shi, and Y. D. Zheng, Appl. Phys. Lett. 88 (2006) 182112; K. M. Chen, Y. X. Zhang, G. G. Qin, S. X. Jin, K. Wu, and C. Y. Li, Z. N. Gu and X. H. Zhou, Appl. Phys. Lett. 69 (1996) 3557].

Experiment

As indicated above, FIG. 16 illustrates schematically, the polymer-inorganic hybrid p-n junction diode, which comprises an ITO-ZnO(n)-PQT-12(p)-Au structure. For this device fabrication a clean ITO coated glass was taken as substrate (<0.005 Ωcm). For a solution-processed ZnO film, we used zinc acetate [Zn(OAc)$_2$] (40 mM) solution in ethanol solvent. The substrate was then dip-coated with this solution with a speed approximately 2 mm/sec with an angle 60° with horizontal and immediately was placed on a 70° C. heater. This process was repeated for four times. The zinc acetate-coated substrate was annealed on a 300° C. hot plate for 30 minutes to form a thin layer of continuous dense polycrystalline ZnO nanoparticle film. The detailed microstructure was studied by AFM. PQT-12 (warmed at 60° C.) of concentration 7 mg/ml was then spin coated (at 800 rpm) from 1,2-dichlorobenzene to form a polymer film over the ZnO-coated ITO substrate. Subsequently 50 nm-thick gold electrodes were deposited using a TEM grid (200 mesh) as shadow mask. After this the whole substrate was annealed at 140° C. for 10 mM then cooled down slowly at approximate 2° C./minute. DC electrical characteristics of diodes were measured by using a semiconductor parameter analyzer (Agilent 4155C). All electrical characterization results reported herein were obtained under ambient atmospheric conditions.

Figure 19A:
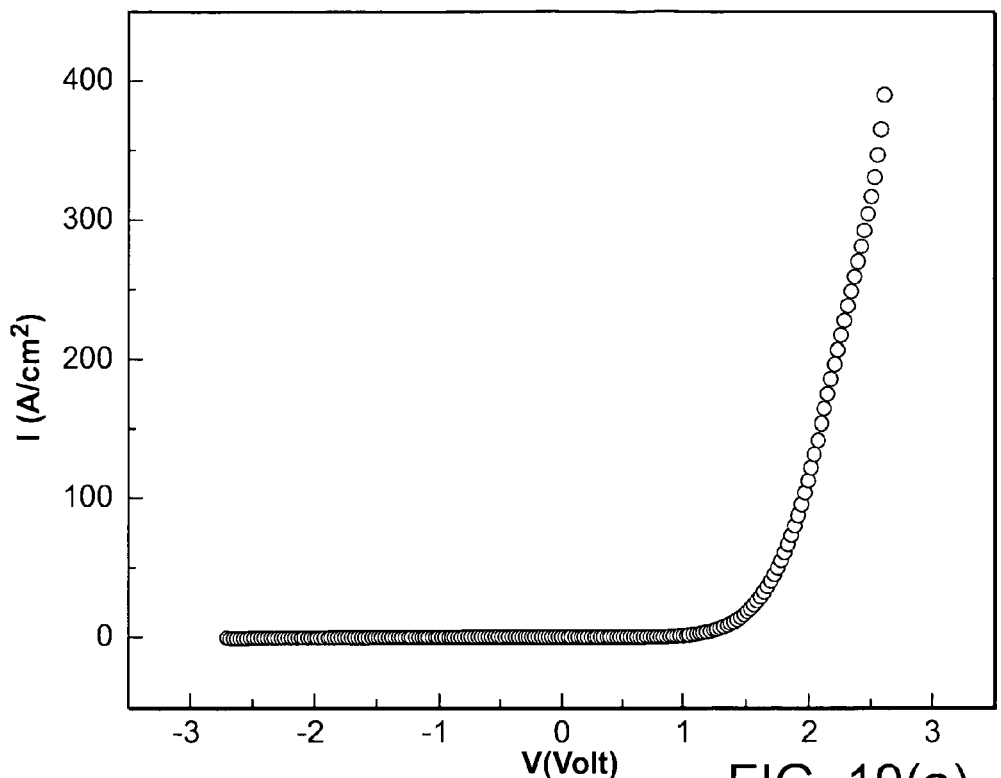
FIGS. 19(a)-(b) are diagrammatic views of current-voltage characteristics of a ITO/ZnO/PQT-12/Au device in a normal scale (FIG. 19(a)) and in a semi-log scale (FIG. 19(b)).
Figure 19B:
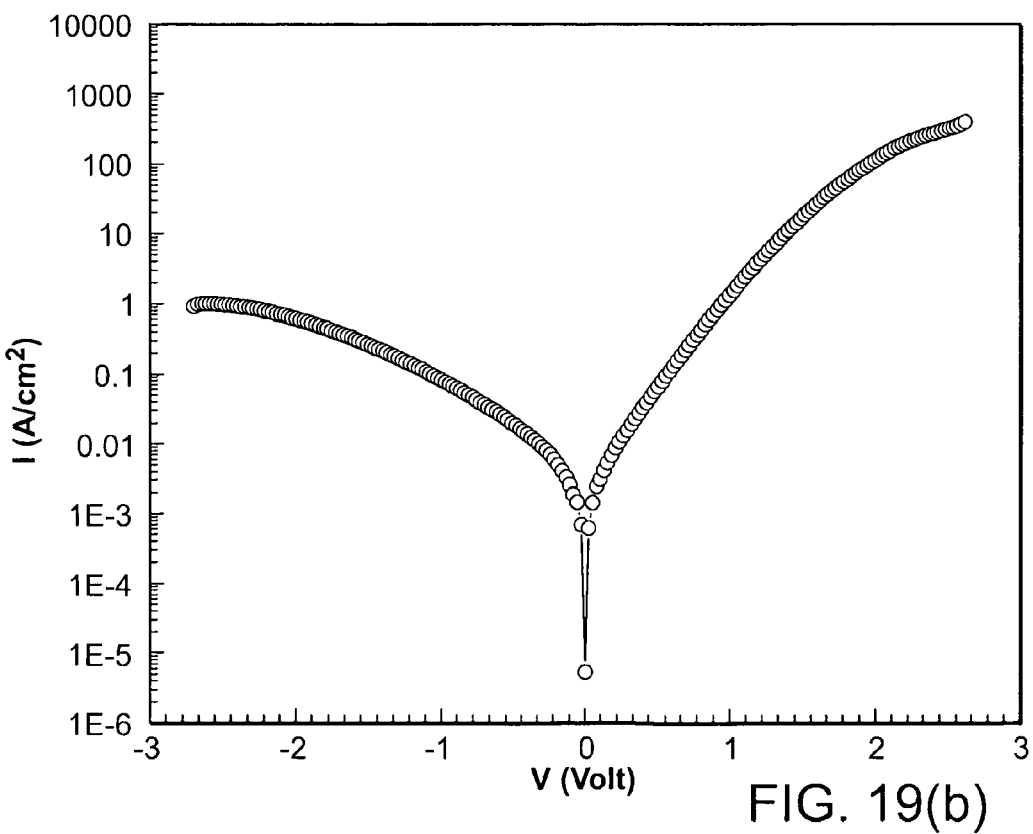
Figure 20A:
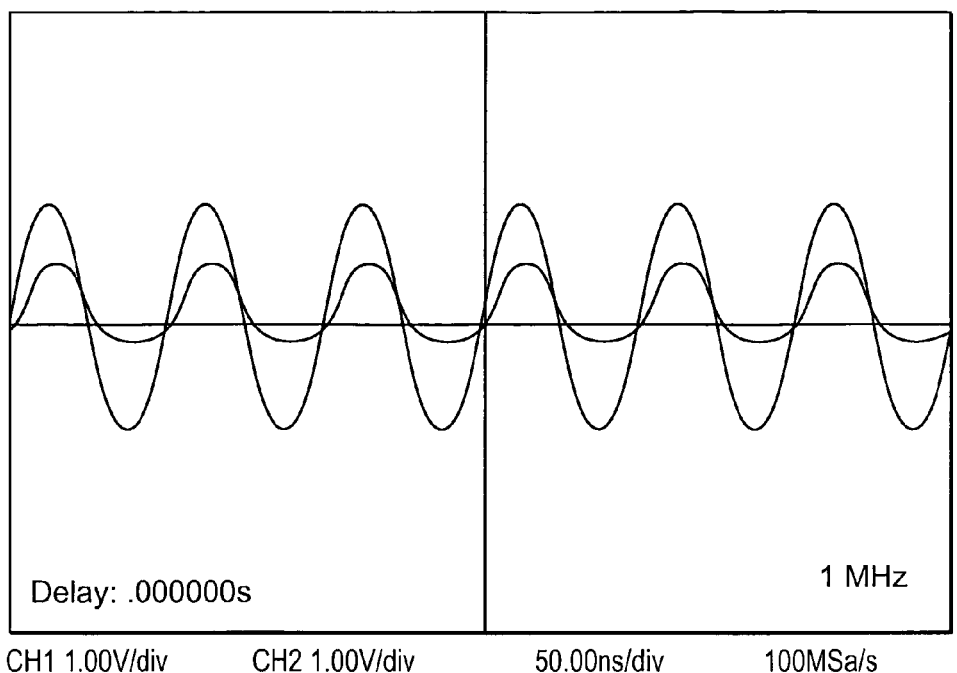
FIGS. 20(a)-(d) are diagrammatic views of rectification behavior at the frequency of 1 MHz (FIG. 20(a)), 5 MHz (FIG. 20(b)), 10 MHz (FIG. 20(c)) and 14 MHz (FIG. 20(d)) for the diode of Example 4.
Figure 20B:
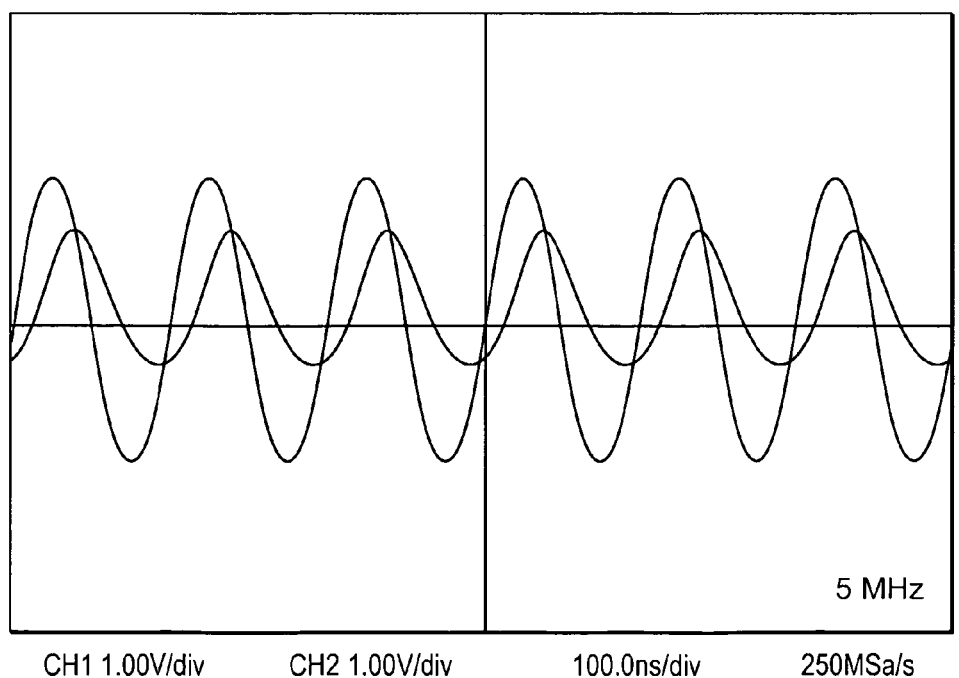
Figure 20C:
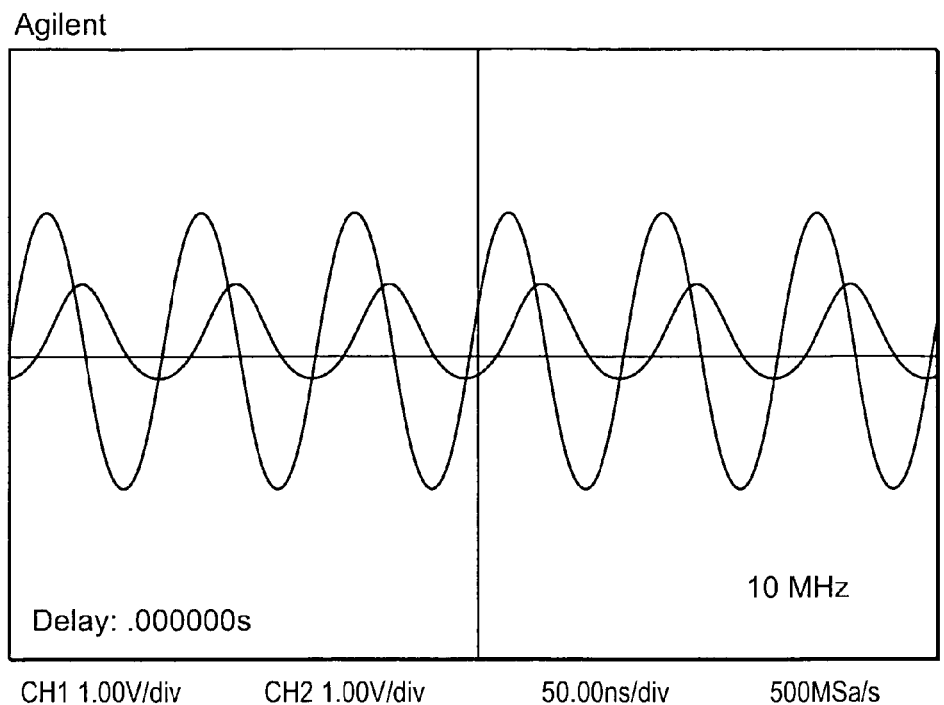
Figure 20D:
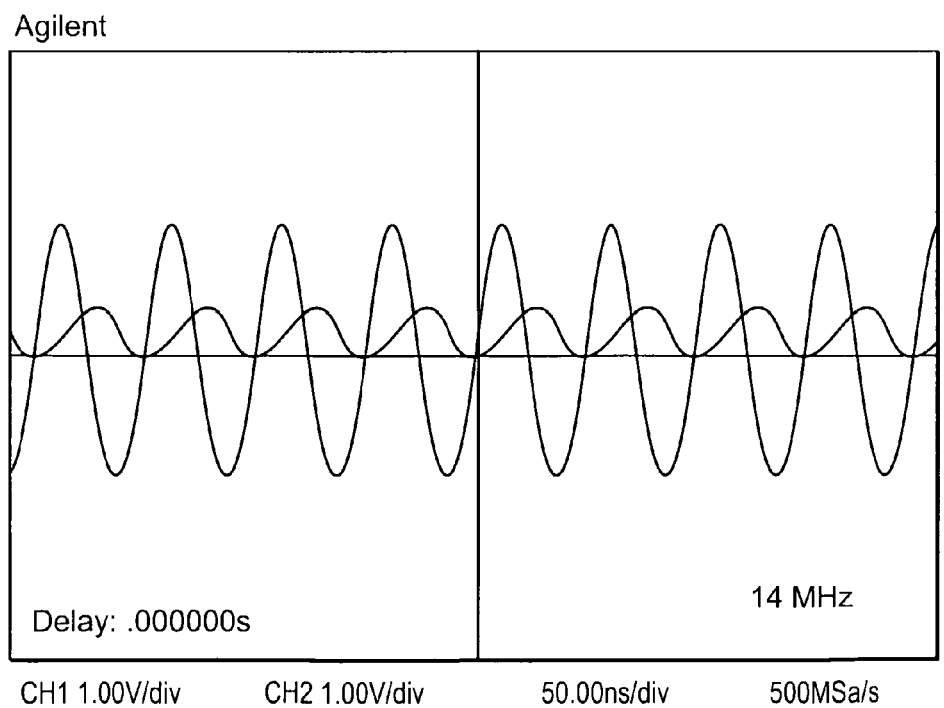

Result and Discussion:

There is shown in FIG. 19(a), the current density-voltage (I-V) characteristics of the device of this example. The current density is 400 A/cm$^2$, which is few orders of magnitude higher then recent polymer vertical diodes [L. S. Roman, M. Berggren, O. Inganas, Appl. Phys. Lett. 75 (1999) 3557; G. Liang, T. Cui, K. Varahramyan, Solid-State Electronics 47 (2003) 691; R. Zhang, A. Barnes, Y. Wang, B. Chambers, and P. V. Wright, Adv. Funct. Mater. 16 (2006) 1161]. The DC rectification ratio at ±2.5 volt is around 4×10$^2$ (see FIG. 19(b)). The turnon voltage is 1.2 volts, which is considerably lower than the previously reported polymer diode. The breakdown voltage of the herein described diode is 15 volts, thirteen times higher than the threshold voltage. The forward bias was analyzed using the thermionic emission model and reverse bias using the reverse soft breakdown model. [S. M. Sze, Physics of semiconductor devices, Wiley, New York, (1981); K. Y. Chiang, H. Y. Tseng, C. Y. Lin, C. P. Kung, and W. H. Hou, Mater. Res. Soc. Symp. Proc. 965 (2007) 0965-S05-18]. The total current can be written as $$I = I_S[\exp(qV/\eta kT) - 1] - I_{tun}[\exp(-qV/\eta_{tun} kT) - 1] \quad (4\text{-}1)$$

where $I_s$ and $I_{tun}$ are the reverse saturation current and tunneling saturation current respectively, and $\eta$ and $\eta_{tun}$ are the ideality factor and tunneling ideality factor. The fitted values of I-V parameters are listed below, and are comparable with other kinds of thin film p-n junction diodes [P. Deb, H. Kim, Y. Qin, R. Lahiri, M. Oliver, R. Reifenberger, and T. Sands, Nano Lett. 6 (2006) 2893].

| Is (A) | H | $I_{tun}$ (A) | $\eta_{tun}$ |
|---|---|---|---|
| 9.02 × 10$^{-5}$ | 17.8 | 5.5 × 10$^{-5}$ | 43.5 |

There is shown in FIGS. 20(a)-(d) the half wave rectification behavior from the fabricated device. In FIGS. 20(a)-(d), the input signals were around 3 volts peak to peak and the signal was taken across 100Ω. Channel 1 and channel 2 refer to the input and rectified signals, respectively. The left and right scales of the plots show the input signal voltage and the rectified current density, respectively. There is a phase shift in the rectified signal which increases with frequency and is caused by the connecting wires, a limitation of our setup. The rectified signal for a particular device remained the same under six hours of steady observation. The long term storage stability of the device was also studied. The device was kept two months in dark and low vacuum, and retested. The results indicate that it essentially maintains its original characteristics. With respect to open atmosphere measurement, the response speed of this device is much higher than the previously reported polymer vertical Schottky diode with relatively less operating voltage.

Figure 21:
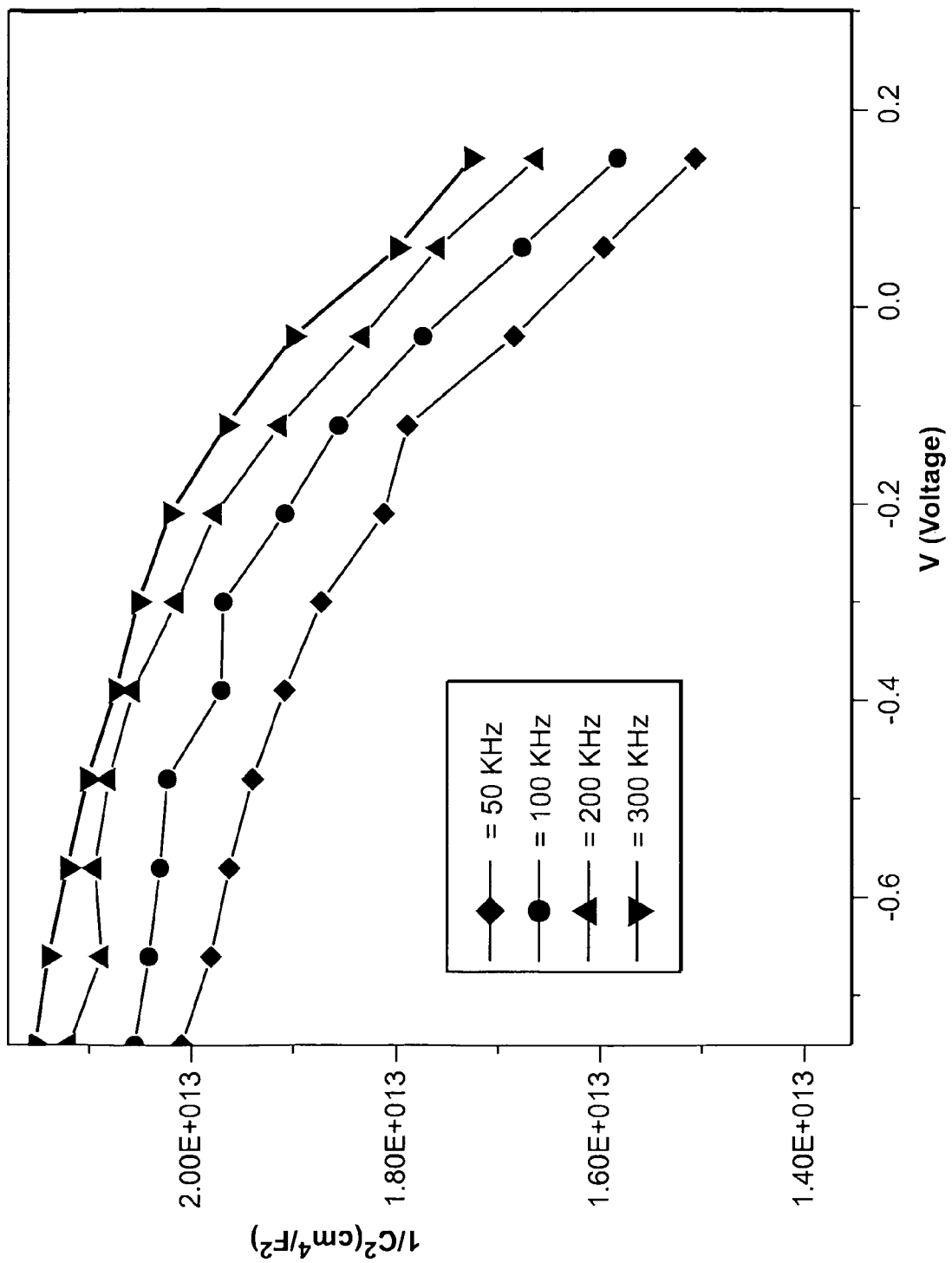
FIG. 21 is a diagrammatic view of the $1/C^2$ versus diffusion voltage ($V_D$) behavior of the measured devices.

The C-V characteristic of the p-n junction diode was measured in the frequency range 50 kHz to 300 KHz using a using an LCR meter (Agilent 4284A). The capacitance per unit area of this kind of heterojunction can be described by Anderson's model, which can be expressed as [D. Song, D. H. Neuhaus, J. Xia, A. G. Aberle, Thin Solid Films, 422 (2002) 180; R. Romero, M. C. López, D. Leinen, F. Martin, J. R. Ramos-Barrado, Mate. Sci. and Eng. B 110 (2004) 87]:

$$C^2 = \frac{qN_D N_A \varepsilon_0 \varepsilon_1 \varepsilon_2}{2(N_A \varepsilon_1 + N_D \varepsilon_2)} \frac{1}{(V_D + V_b)} \quad (4\text{-}2)$$

where q is the electronic charge, $\varepsilon_0$ is the vacuum permittivity, $\varepsilon_1$ and $\varepsilon_2$ are the dielectric constants of n-ZnO and p-PQT-12 respectively, $N_D$ and $N_A$ are the doping density concentrations in the n-ZnO and p-PQT-12 respectively, $V_D$ is the diffusion voltage and V is the applied voltage. There is shown in FIG. 21, the 1/d Vs $V_D$ behavior of the measured devices, where almost linear behaviors in the 0.0 to −0.8 V range are observed. This behavior is a clear indication that the fabricated diode is an abrupt junction.

Figure 22:
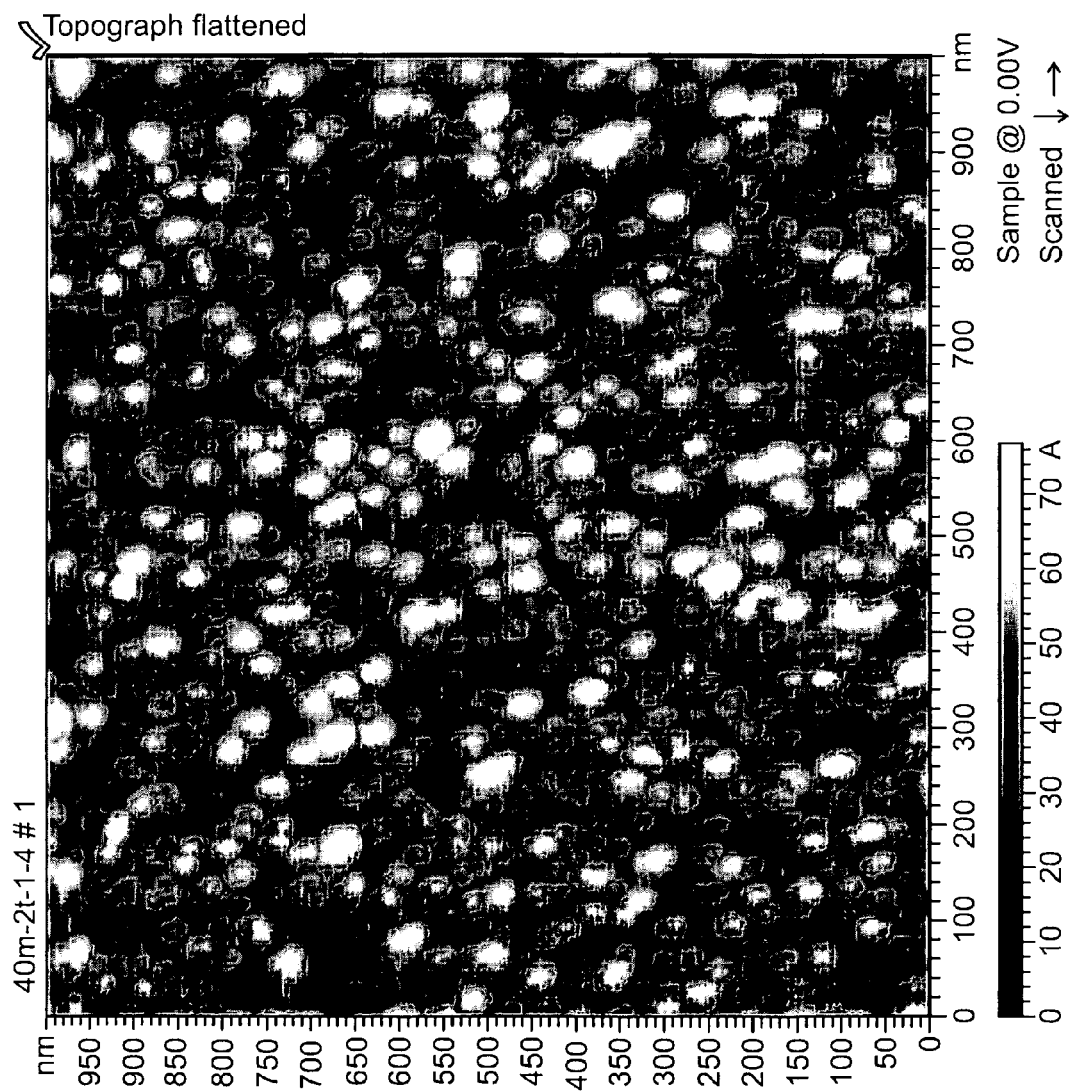
FIG. 22 is an illustration of an atomic force microscope image of the polycrystalline ZnO film.
Figure 23A:
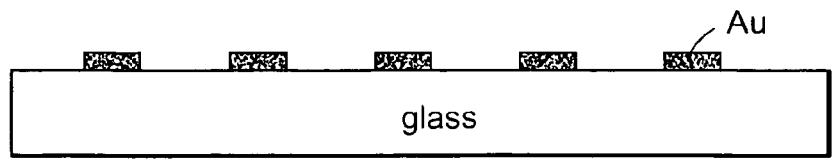
FIG. 23 illustrates fabrication of pentacene Schottky diodes with P3HT used as interface layer.
Figure 23B:
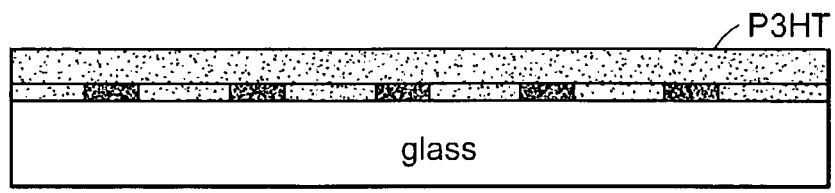
Figure 23C:
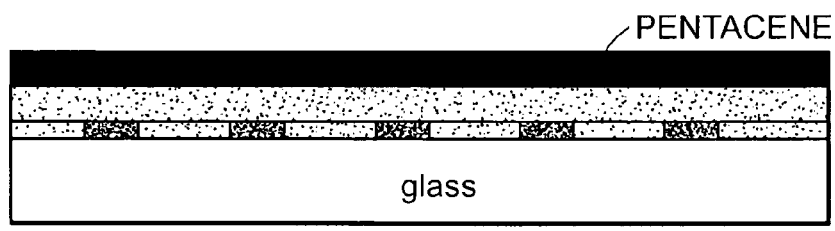
Figure 23D:
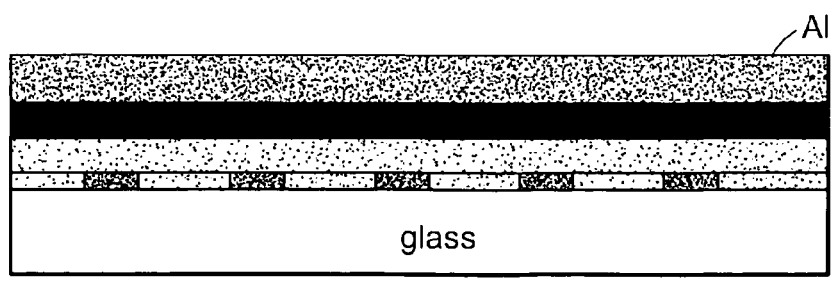
Figure 23E:
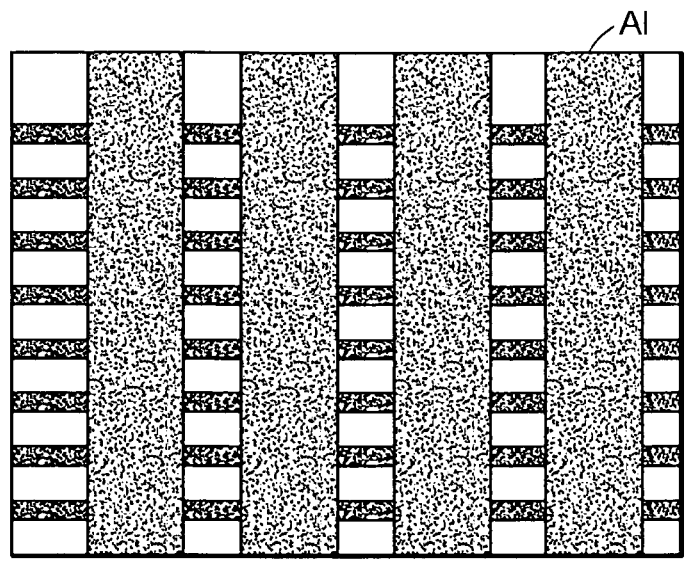
Figure 23E:
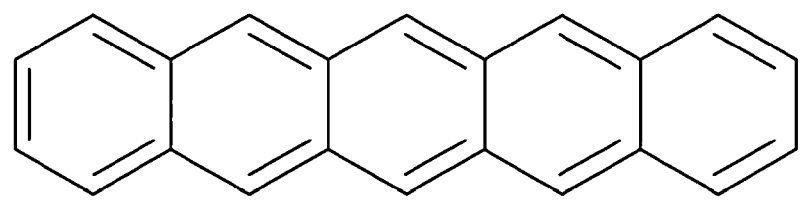
Figure 23E:
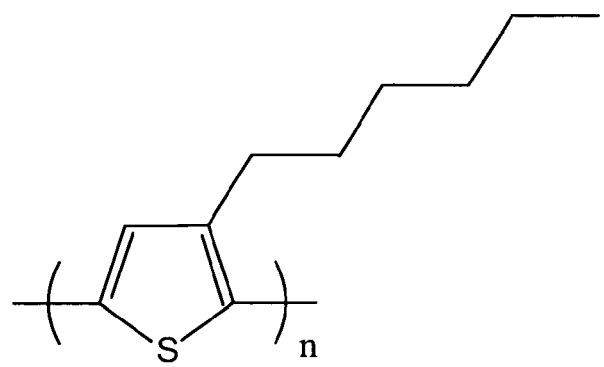

There is shown in FIG. 22 an AFM micrograph of the ZnO layer. The image shows a film of dense ZnO nanoparticles with average particle size around 40 nm. Detailed surface examination indicates that there is a lack of pinholes throughout the film with low surface roughness (10 nm). This low roughness of the ZnO-coated film is favorable for the overlying polymer (PQT-12) film to avoid pinholes through the top surface. Thus, electrons cross one or two grains of ZnO particles from the ITO electrode whereas holes cross the nanometer-range film of PQT-12 from the top Au electrode to recombine at the interface. It is believed that this short range recombination mechanism is one of the key reasons for the high current density and high frequency rectification.

Figure 24A:
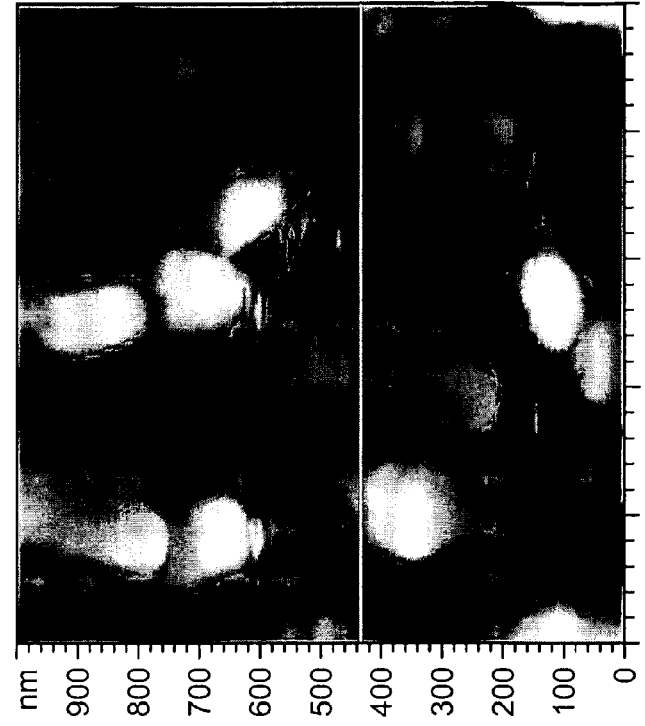
FIG. 24(a)-(b) are illustrations of atomic force microscope (AFM) images, an AFM image of pentacene film on bare Au electrode (FIG. 24(a)) and an AFM image of pentacene film on P3HT/Au electrode (FIG. 24(b)).
Figure 24A:
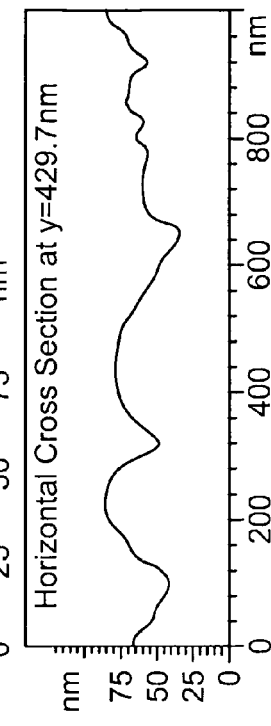
Figure 24B:
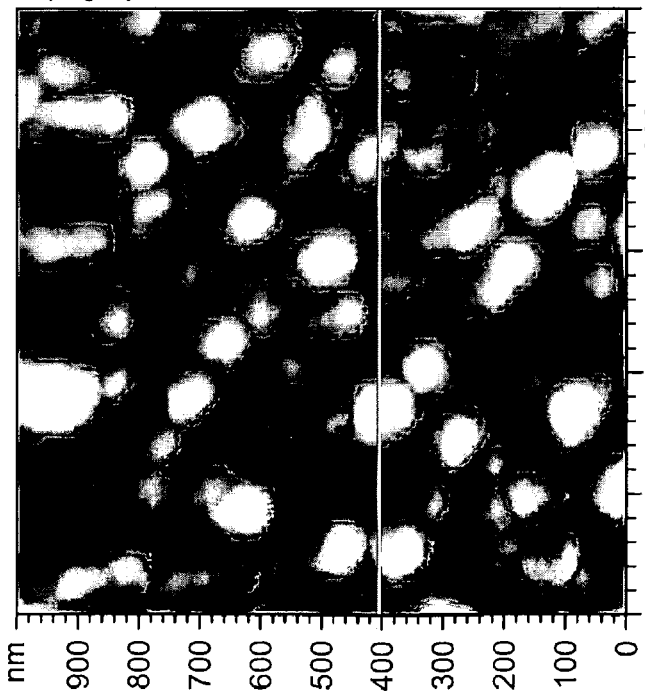
Figure 24B:
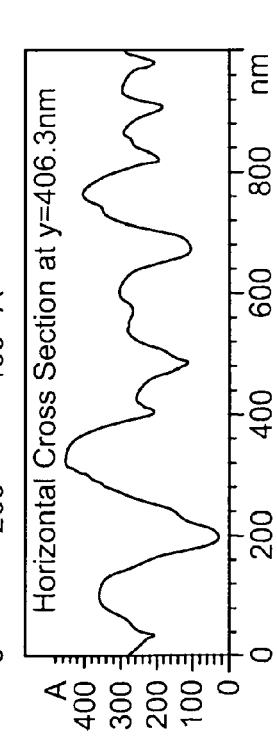
Figure 25:
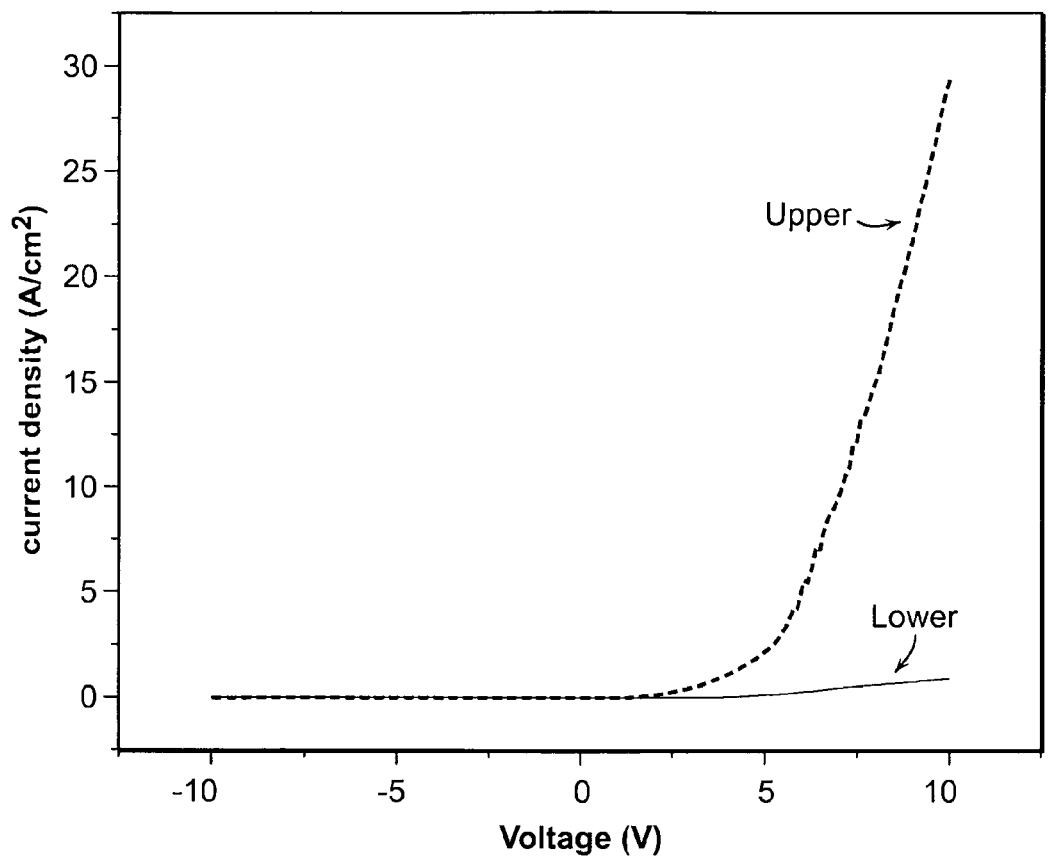
FIG. 25 is a diagrammatic view of I-V measurement of pentacene Schottky diode with and without P3HT as interface layer (upper curve represents pentacene schottky diode with P3HT as interface layer and lower curve extending to right represents pentacene Schottky diode without P3HT as interface layer).
Figure 26B:
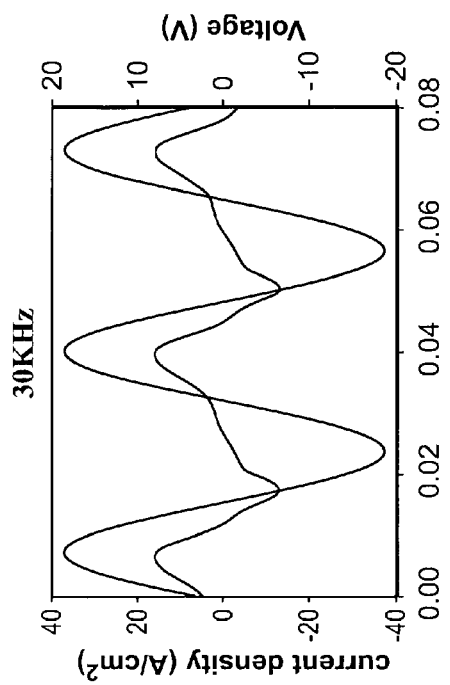
FIGS. 26(a)-(b) are diagrammatic views of current response as a function of time for a pentacene based Schottky diode without P3HT as an interface layer under different frequencies of AC voltage input.
Figure 26D:
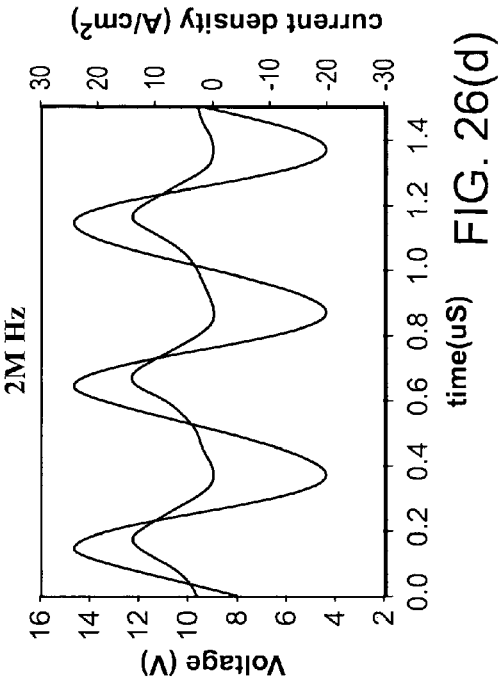
FIGS. 26(c)-(d) are diagrammatic views of current response as a function of time for a pentacene Schottky diode with P3HT as interface layer under different frequencies of AC voltage.
Figure 26A:
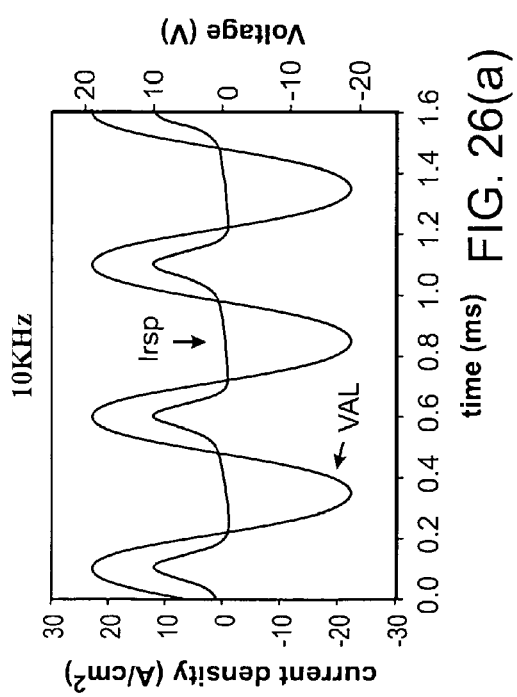
Figure 26C:
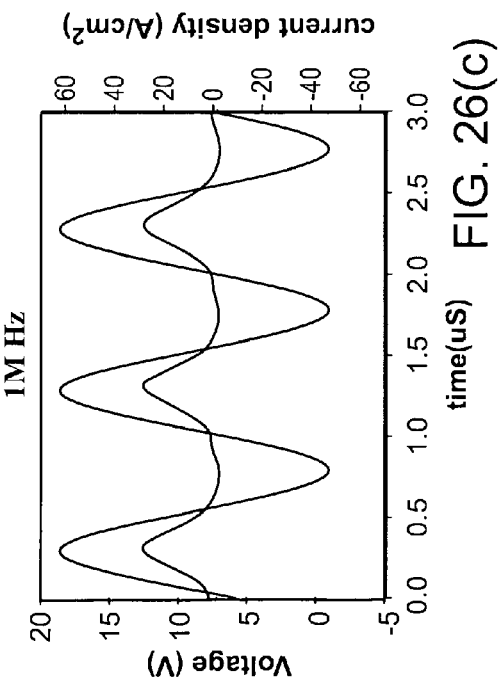

Also provided is additional evidence for the correlation between morphology and current density from a parallel study of Au/P3HT/pentacene/Al Schottky diodes. There is shown in FIG. 23 a fabrication process leading to the schematic structure of this diode. There is shown in FIGS. 24(a)-(b) AFM images of pentacene films on Au electrodes with and without P3HT. Larger grain sizes (~250 nm) were observed when pentacene was deposited on the P3HT-Au-electrode, preferable for charge transport. I-V characteristics of the pentacene diode with and without P3HT as interface layer are shown in FIG. 25. The maximum current density at 10V was 30 A/cm$^2$ in the presence of the P3HT interface layer; however, without the interface layer, the current density was only 0.8 A/cm$^2$. Thus, it can be concluded that carrier transport throughout the film was more facile when pentacene grain size increased from 150 nm to 250 nm (and the electrode junction became more graded) after adding P3HT as the interface layer. There is shown in FIGS. 26(a)-(d), the response speed of the pentacene-based Schottky diode with (FIGS. 26(c)-(d)) and without P3HT (FIGS. 26(a)-(b)) as an interface layer. Response speed at frequencies of 2 MHz was achieved with the interface layer. Without the interface layer, the maximum rectification speed was only 30 kHz.

CONCLUSION

In summary, there is described an example describing fabrication and characterization of a vertical p-n junction polymer-inorganic hybrid diodes. The maximum current density is 400 A/cm$^2$ and the AC rectification is fully maintained up to 14 MHz. The current density and rectification speed in the open atmosphere are much higher than previously reported all-polymer vertical diodes with relatively lower operating voltage, and the stability is encouraging. The capacitance-voltage (C-V) study also implies that device structure can be portrayed as a p-n junction diode.

Although a preferred embodiment of the invention has been described using specific terms, such description is for illustrative purposes only, and it is to be understood that changes and variations may be made without departing from the spirit or scope of the following claims.

INCORPORATION BY REFERENCE

All patents, published patent applications and other references disclosed herein are hereby expressly incorporated by reference in their entireties by reference.

EQUIVALENTS

Those skilled in the art will recognize, or be able to ascertain using no more than routine experimentation, many equivalents of the specific embodiments of the invention described herein. Such equivalents are intended to be encompassed by the following claims.

What is claimed is:

1. An organic/polymer diode comprising:
a first layer composed essentially of one of an organic semiconductor material or a polymeric semiconductor material;
a second layer deposited on the first layer and being electrically coupled to the first layer, wherein the second layer includes an inorganic semiconductor material comprising an inorganic oxide that exhibits electron carrying semiconductor characteristics;
a plurality of electrodes, one electrode being electrically coupled to each of the first layer and the second layer such that the current flows through the first and second layers and the electrodes in one direction when a voltage is applied in one direction; and
wherein the second layer is essentially composed of a material whose characteristics and properties are such that when formed on the first layer, the diode is capable of high frequency rectifications.

2. The organic/polymer diode of claim 1, wherein the diode is capable of high frequency rectifications at one of above 100KHz, 500KHz, 1MHz, or 10 MHz when exposed to atmosphere. in one of an atmospheric environment, an inert gas environment or a vacuum environment.

3. The organic/polymer diode of claim 1, wherein the inorganic oxide is zinc oxide.

4. The organic/polymer diode of claim 1, wherein the polymeric semiconductor material comprise thiopene rings with alkyl side chains.

5. The organic/polymer diode of claim 1, wherein the organic semiconductor layer comprises a material within a class of ACENE compounds.

6. The organic/polymer diode of claim 1, wherein the organic semiconductor layer comprises pentacene.

* * * * *

UNITED STATES PATENT AND TRADEMARK OFFICE
CERTIFICATE OF CORRECTION

| | | |
|---|---|---|
| PATENT NO. | : 8,330,149 B2 | Page 1 of 1 |
| APPLICATION NO. | : 12/680308 | |
| DATED | : December 11, 2012 | |
| INVENTOR(S) | : Howard Edan Katz, Jia Sun and Nath Bhola Pal | |

It is certified that error appears in the above-identified patent and that said Letters Patent is hereby corrected as shown below:

In the Specification

Col. 1, Line 17, should be replaced with

-- STATEMENT OF GOVERNMENTAL INTEREST

This invention was made with government support under grant no. FA9550-06-0076, awarded by the Department of Defense and grant no. DE-FG02-07ER46465, awarded by the Department of Energy. The government has certain rights in the invention. --.

Signed and Sealed this
Thirtieth Day of June, 2015

Michelle K. Lee
*Director of the United States Patent and Trademark Office*